United States Patent
Hayakawa

(10) Patent No.: US 7,728,321 B2
(45) Date of Patent: Jun. 1, 2010

(54) PHASE CHANGE MEMORY DEVICE AND METHOD OF MANUFACTURING THE DEVICE

(75) Inventor: Tsutomu Hayakawa, Tokyo (JP)

(73) Assignee: Elpida Memory Inc., Tokyo (JP)

( * ) Notice: Subject to any disclaimer, the term of this patent is extended or adjusted under 35 U.S.C. 154(b) by 421 days.

(21) Appl. No.: 11/518,172

(22) Filed: Sep. 11, 2006

(65) Prior Publication Data

US 2007/0069249 A1    Mar. 29, 2007

(30) Foreign Application Priority Data

Sep. 12, 2005   (JP)   ............... 2005-264484

(51) Int. Cl.
*H01L 45/00*   (2006.01)
(52) U.S. Cl. .............. 257/4; 257/2; 257/E45.002; 365/148
(58) Field of Classification Search .............. 257/2, 257/4, 214, 298, E45.002, E29.17; 438/95; 365/148
See application file for complete search history.

(56) References Cited

U.S. PATENT DOCUMENTS

| | | | | |
|---|---|---|---|---|
| 5,166,758 | A | * | 11/1992 | Ovshinsky et al. .............. 257/3 |
| 7,214,957 | B2 | * | 5/2007 | Ryoo et al. ..................... 257/2 |
| 2004/0245554 | A1 | | 12/2004 | Oh et al. |
| 2005/0098811 | A1 | | 5/2005 | Ogiwara |
| 2005/0174861 | A1 | * | 8/2005 | Kim et al. .................... 365/200 |

FOREIGN PATENT DOCUMENTS

| | | |
|---|---|---|
| JP | 2003-332529 | 11/2003 |
| JP | 2004-363586 | 12/2004 |
| JP | 2005-150243 | 6/2005 |
| JP | 2005-159325 | 6/2005 |

OTHER PUBLICATIONS

Japanese Office Action with partial English Translation, issued in Japanese Patent Application No. JP 2005-264484, dated Mar. 17, 2010.

* cited by examiner

*Primary Examiner*—Victor A Mandala
*Assistant Examiner*—Scott Stowe
(74) *Attorney, Agent, or Firm*—McDermott Will & Emery LLP

(57) ABSTRACT

The invention provides a novel structure of a phase change memory device. In the phase change memory device of the invention, an electrode acting as a radiating fin does not exit immediately above a phase change area of a phase change layer (115). A heater electrode (111) and landing electrode layer (113a, 114a) both contact the bottom of the phase change layer (115) made of GST. The landing electrode layer (113a, 114a) contacts the bottom of the phase change layer (115) to partially overlap in a region off from a portion immediately above the contact face (Y) of the phase change layer and heater electrode. The contact electrode (116, 118) is directly connected to the landing electrode layer (113a, 114a) in a portion off from a portion immediately above the heater electrode (111). The phase change layer of GST or the like does not exist immediately below the contact electrode.

12 Claims, 24 Drawing Sheets

FIG. 21

| | IV | V | VI | VII |
|---|---|---|---|---|
| 1 | | | | |
| 2 | | | O | |
| 3 | Si | P | S | Cl |
| 4 | Ge | As | Se | Br |
| 5 | Sn | Sb | Te | I | ns of the set pulse S1 has a peak value exceeding a threshold Vth. A reset pulse S2 has a peak value higher than that of the set pulse S1 and a width shorter than that of the set pulse S1. A read pulse S3 has a peak
PHASE CHANGE MEMORY DEVICE AND METHOD OF MANUFACTURING THE DEVICE

FIELD OF THE INVENTION

The present invention relates to a phase change memory device and method of manufacturing the phase change memory device.

BACKGROUND OF THE INVENTION

The phase change memory device is a storage device using a phase change layer (chalcogenide alloy and the like) having the electrical resistance varying corresponding to its crystalline state, as a memory element. The chalcogenide alloy is an amorphous semiconductor including a chalcoge element.

FIG. 21 is a view showing part of the periodic table to explain chalcoge elements.

As shown in the figure, chalcoge elements include S (sulfur), Se (selenium) and Te (tellurium) of the sixth group of the periodic table. Application fields of the chalcogenide alloy are broadly divided into the optical disk and electrical memory. As a chalcogenide alloy used in the field of the electrical memory, there are known GeSbTe (hereinafter, referred to as GST) that is a compound of Ge (germanium), Te (tellurium) and Sb (antimony), AsSbTe, SeSbTe and the like.

FIGS. 22A and 22B are views to explain the principle of the phase change memory.

As shown in FIG. 22A, the chalcogenide alloy can form two stable states, an amorphous semiconductor state 10 and crystalline state 30, and it is necessary to supply heat exceeding an energy barrier 20 to cause transition from the amorphous state 10 to crystalline state 30.

As shown in FIG. 22B, the chalcogenide alloy of the amorphous state indicates high resistance. The high resistance state corresponds to a digital value of "1". The chalcogenide alloy of the crystalline state indicates low resistance. The low resistance state corresponds to a digital value of "0". Thus, by detecting a difference between current amounts (or voltage drop) passed through the chalcogenide alloy, it is possible to determine whether the storage information is "1" or "0", (i.e. to read the information).

Joule heat is used as heat to supply to the chalcogenide alloy for phase transition. In other words, by supplying pulses with different peak values and different durations to the chalcogenide alloy, Joule heat is generated in a contact face between an electrode and the chalcogenide alloy and its vicinity. The phase of the chalcogenide alloy changes by the Joule heat.

More specifically, the chalcogenide alloy becomes an amorphous state when supplied with heat near its melting point for a short time and cooled rapidly. Meanwhile, the chalcogenide alloy becomes a crystalline state when supplied with heat of its crystallization point lower than the melting point for a long time and then cooled.

For example, when GST is supplied with heat near its melting point (about 610° C.) for a short time (1 to 10 ns) and then cooled rapidly (for about 1 ns), GST becomes an amorphous state. Meanwhile, when GST is supplied with heat of its crystallization point (about 450° C.) for a long time (30 to 50 ns) and then cooled, GST becomes a crystalline state.

As shown in FIG. 22B, causing transition from the amorphous state to crystalline state is called "set (crystallization process)", and a pulse supplied to the chalcogenide alloy is called a "set pulse". It is herein assumed that the minimum temperature (crystallization temperature) required for crystallization is Tc, and that the minimum time (crystallization time) required for crystallization is tr.

Inversely, causing transition from the crystalline state to amorphous state is called "reset (non-crystallization process)", and a pulse supplied to the chalcogenide alloy is called a "reset pulse". The heat supplied to the chalcogenide alloy has temperatures near the melting point Tm, and the chalcogenide alloy is cooled rapidly after melting.

FIGS. 23A to 23D are views to explain a basic structure of a phase change memory device and the set/reset operation of the phase change memory device.

As shown in FIG. 23A, the phase change memory device basically has a structure that a chalcogenide alloy layer (phase change layer) 46 is sandwiched between upper and lower electrodes (48, 42). In addition, reference numeral 40 denotes a substrate, and reference numeral 44 denotes an electrical insulating film. A terminal P to which a set pulse or the like is applied is connected to the upper electrode 48, and the lower electrode 42 is fixed to the ground (reference potential).

As shown in FIG. 23B, the phase change memory device in FIG. 23A is equivalent to a resistance R1. As described above, a resistance value of the resistance R1 varies according to whether the chalcogenide alloy layer is an amorphous state or crystalline state. As shown at the left side in FIG. 23B, three kinds of pulses are input to the terminal P. A set pulse S1 has a peak value exceeding a threshold Vth. A reset pulse S2 has a peak value higher than that of the set pulse S1 and a width shorter than that of the set pulse S1. A read pulse S3 has a peak value less than the threshold Vth and a width wider than that of the set pulse S1. Herein, Vth is a voltage of lower limit to enable generation of Joule heat required for crystallization.

FIG. 23C shows correspondence between the set pulse S1 and increases in temperature caused by Joule heat generated by supply of the set pulse S1. FIG. 23C shows a waveform of the voltage on the upper side, and increases in temperature by Joule heat on the lower side.

A value of the voltage of the set pulse S1 exceeds the predetermined threshold Vth, and a time duration of the pulse is $t_{cry}$. $t_{cry}$ is longer than the crystallization time tr (minimum time required for crystallization of the chalcogenide alloy). The temperature increased by Joule heat is significantly lower than melting point Tm, while being higher than the minimum temperature Tc (crystallization temperature) required for crystallization.

FIG. 23D shows correspondence between the reset pulse S2 and increases in temperature caused by Joule heat generated by supply of the reset pulse S2. FIG. 23D shows a waveform of the voltage on the upper side, and increases in temperature by Joule heat on the lower side.

As shown in the figure, a peak value of the reset pulse S2 largely exceeds the threshold Vth for crystallization, and a width of the pulse is sufficiently narrow. The increased temperature by Joule heat thereby exceeds melting point Tm of the chalcogenide alloy. Further, the time $t_{amo}$ taken from the peak of the increased temperature to crystallization temperature Tc is adequately short. The chalcogenide alloy is thereby once melted and then cooled rapidly, and as a result, is reset to an amorphous state.

FIG. 24 is a circuit diagram to explain the read operation in the phase change memory device. In FIG. 24, common portions to those in the figures described above are assigned the same reference numerals.

In FIG. 24, W indicates a word line, G indicates a ground line, and B indicates a bit line (that is a pulse input line connected to the terminal P to input the set pulse S1, reset pulse S2 and read pulse S3). Further, R1 indicates an equivalent resistance of the phase change memory element (comprised of a chalcogenide alloy layer 60).

M4 indicates an NMOS transistor (switching element) to select a memory cell, R2 indicates a current/voltage conversion resistance, A1 indicates a sense amplifier, and reference numeral 62 denotes a reference voltage source of the sense amplifier A1. I1 indicates a current passed through the memory cell in the read operation, and Vout indicates an output voltage (sensing output) of the sense amplifier A1.

In the set operation (in the same way as in the reset operation and read operation), the NMOS transistor M4 is turned on with the word line W being an active line, and then, a required pulse (one of S1 to S3) is input from the terminal P. The read pulse S3 is input in the read operation.

A resistance value of the resistance R1 varies whether the chalcogenide alloy layer 60 constituting a memory cell is an amorphous state or crystalline state, and in response to the resistance value, a current amount of the current I1 varies. Accordingly, by converting the current amount into a voltage value to read, it is possible to determine whether the stored information is "1" or "0".

The inventor of the present invention made various studies on the structure of the phase change memory device before the invention, and as a result of the study, found that following inconveniences can occur in the conventional structure.

As shown in FIG. 23A, the phase change memory device generally adopts a basic structure where a phase change layer (for example, GST) is sandwiched between upper and lower electrodes (for example, see JP 2005-159325). In other words, an electrode made of metal such as tungsten or the like exists on the phase change layer. The upper electrode made of metal such as tungsten or the like also has heat radiation characteristics. Accordingly, the conventional phase change memory element is regarded as having a structure such that a radiating fin is formed immediately above the phase change area.

As described above, since phase transition of the chalcogenide alloy layer is implemented by using Joule heat caused by applying the current, dissipation of Joule heat via the upper electrode (upper metal layer) leads to a reduction in thermal efficiency and is not preferable.

The reduction in thermal efficiency does not become a significant problem at the prototyping stage of discrete phase change memory element and memory LSI with a low degree of integration, but becomes a serious problem at the actual mass production stage of phase change memory device with a high degree of integration using the fine patterning process.

In other words, to increase the capacity of a phase change memory device, it is required to decrease the size of the memory cell, and therefore, a reduction in reset current (that is to restore the phase change layer from the crystalline state to amorphous state) is an important issue. That is, when a metal layer is laminated on the phase change layer, the upper metal layer functions as a radiating fin, and the thermal efficiency deteriorates, resulting in a factor for prohibiting the reduction in the current amount of the reset current. It is thus not possible to achieve a large scale of phase change memory LSI.

A technique is disclosed in JP 2003-332529 where a lower electrode (heater electrode) is formed in a shape with a pointed top, the contact face between the electrode and the phase change layer is thereby minimized to decrease the current, and radiation is thus suppressed. However, to process the lower electrode to the shape with a pointed top, specialized manufacturing process technique is required that is not used in typical LSI manufacturing, and it is undeniable that such a technique results in increases in complexity and cost.

Further, the upper metal layer has a predetermined thickness, and therefore, the heat also escapes from the side portion of the upper metal. Accordingly, decreasing the thickness of the upper metal layer is considered to suppress heat dissipation from the upper metal layer as much as possible. However, the decrease in the thickness of the upper metal layer makes the cross-sectional area smaller, increases the wiring resistance, and results in deterioration in circuit characteristics.

The upper metal layer acts as an etching stopper in making an opening for a contact hole in an interlayer insulating film, and prevents the undercoated phase change layer (for example, GST film) from being exposed. Accordingly, when the upper metal layer is thinned, in forming contact holes in the interlayer insulating film by etching, a risk occurs that the upper metal layer is penetrated, the phase change layer (for example, GST film) is exposed, and components of the phase change layer are volatilized and pollute the line.

When the phase change layer is partially exposed, such a problem may arise that components of the phase change layer are sublimated and disappear by heat treatment subsequently performed in embedding a metal layer to be contact electrodes. Further, it is feared that component gases of the phase change layer fill the contact hole, an adequate amount of the metal gas to form the contact electrode cannot reach the inside of the contact hole, and that failure occurs in growth of the embedded electrode.

Further, as described previously, the adhesion between the phase change layer and interlayer insulating film is regarded as being not good, and an adhesion layer comprised of an extremely thin film of metal such as titanium (Ti) or the like is sometimes provided between the layer and film. In this case, since the adhesion layer (Ti or the like) contacts the bottom of the phase change layer (for example, GST film), it may occur that components of both layers are bonded (for example, Ti (titanium) and Te (tellurium) are bonded), and the composition of the phase change layer changes in the contact face between the phase change layer and adhesion layer and its vicinity, resulting in an adverse effect on rewritable characteristics of the phase change layer.

Furthermore, the upper metal layer needs to be always provided to cover the top face of the phase change layer (GST film). In other words, the upper metal layer and the phase change layer (GST film) are paired, and cannot be divided in integration. Accordingly, it is not possible to use the upper metal layer in forming wiring and electrode in a peripheral circuit. Therefore, in forming wiring and electrode in a peripheral circuit, independently of processes of forming and processing a metal layer in a memory cell portion, it is necessary to newly add processes of forming and processing a metal layer, and the manufacturing process cannot be simplified.

Thus, it is undeniable that the thermal efficiency in writing (particularly, in reset) deteriorates in the phase change memory device with the conventional structure. Further, as described above, the problems exist in the mass production of a large scale of phase change memory LSI.

The present invention has been carried out based on the aforementioned consideration, and it is an object of the invention to achieve a phase change memory device of a structure with high thermal efficiency, and enable mass production of a large scale of phase change memory LSI while solving the problems due to mass production of the phase change memory device.

SUMMARY OF THE INVENTION

A preferred aspect of a phase change memory device of the invention adopts a novel electrode structure (where an electrode does not exist on the upper side of the phase change layer) using a landing electrode. A heater electrode and the landing electrode both contact the bottom of a phase change layer. The landing electrode is connected to the bottom of the phase change layer in a region off from a portion immediately above the contact face between the phase change layer and heater electrode. The contact electrode is connected directly to the top face of the landing electrode layer in a portion off from a portion above the heater electrode. Since an electrode acting as a radiating fin does not exist immediately above a phase change area of the phase change layer, Joule heat caused by the current is not dissipated via an electrode unlike the conventional structure, and thermal efficiency is improved in phase change treatment. Accordingly, the reset current can be reduced, and the memory cell size can be decreased. Further, since the upper electrode as in the conventional structure does not exist, any problems do not occur with the thickness of the electrode. In other words, in a phase change memory element of the invention, it is possible to form a landing electrode layer with a sufficient thickness without any problems, and the resistance in wiring can thus be reduced. Further, the phase change layer such as GST or the like does not exist immediately below the contact electrode, and any problems do not occur such as pollution due to exposure of the phase change layer in making an opening for a contact hole, sublimation and/or disappearance of part of the layer, and occurrence of failure in embedding the contact hole. Furthermore, in the structure of the phase change memory element of the invention, the bottom of the phase change layer is brought into contact with the landing electrode (metal layer), and the adhesion is improved as compared with the conventional structure where the phase change layer is brought into contact with the insulating film. Moreover, even when an adhesion layer comprised of a thin film of titanium (Ti) or the like is formed on the landing electrode layer to improve the adhesion, since the adhesion layer does not contact the phase change layer in a region where phase transition occurs, the problem as in the conventional structure does not arise that components of both layers are bonded in the region where phase transition occurs and that the composition changes, and therefore, the rewritable characteristics are not affected. The landing electrode layer (metal layer of tungsten (w) or the like) exits independently of the phase change layer in the manufacturing process, it is thereby possible to form the electrode and wiring in a peripheral circuit concurrently with formation of the landing electrode layer in a memory cell, and the manufacturing process can be shared. Further, by varying patterns of the landing electrode layer, it is possible to freely change a formation position of the contact electrode, and flexibility in design of layout is improved.

In another preferred aspect of the phase change memory device of the invention, the heater electrode is embedded in the interlayer insulating film. On the interlayer insulating layer in which the heater electrode is embedded, an insulating film is provided that is patterned to expose the heater electrode. The landing layer with a predetermined pattern is formed on the insulating film. The phase change layer is connected to the heater electrode, and formed to partially overlap the landing electrode layer. Then, the contact electrode is directly connected to the landing electrode layer in a portion off from a portion immediately above the heater electrode. By such a structure, all the problems feared in the conventional phase change memory device are solved, and it is possible to provide a phase change memory element having a structure provided with high thermal efficiency, and perform mass production of a large scale of phase change memory LSI.

In another preferred aspect of the phase change memory device of the invention, the landing electrode layer is comprised of a main electrode layer, and an adhesion layer formed on the surface of the main electrode layer to improve the adhesion with the phase change layer. The adhesion between the phase change layer and landing electrode layer can be improved by providing the adhesion layer (titanium (Ti) or the like) on the main electrode layer (for example, metal layer of tungsten (W) or the like) that is a structural element of the landing electrode layer. Since the adhesion layer does not contact the phase change layer in a region where phase transition occurs, the problem as in the conventional structure does not arise that components of both layers are bonded in the region where phase transition occurs and that the composition changes, and therefore, the rewritable characteristics are not affected.

In another preferred aspect of the phase change memory device of the invention, the phase change layer is a chalcogenide alloy layer. The chalcogenide alloy layer has a difference in resistance more than ten times between its amorphous state and crystalline state, and is suitable as a phase change storage material. Further, the device has an affinity for the manufacturing process of silicon-based LSI, and has an advantage that its manufacturing is readily.

In another preferred aspect of the phase change memory device of the invention, the memory cell includes one of an insulating gate type field-effect transistor, bipolar transistor and diode connected to the heater electrode as well as the memory element. Further, around the memory cell is formed a peripheral circuit including an address selecting circuit to select the memory cell.

In still another preferred aspect of the phase change memory device of the invention, the memory cell is formed in a combination with a switching element such as an insulating gate type field-effect transistor, bipolar transistor or diode (including a Schottky diode as well as a junction diode), the peripheral circuit including the address circuit is integrated, and the phase change memory LSI is thus formed. The phase change memory device of the invention has many advantages that the thermal efficiency is high, the problems in the manufacturing process feared in the conventional structure are all solved, the manufacturing steps can be shared, and that flexibility in design of layout is high. Accordingly, it is possible to stably produce a large scale of phase change memory LSI in large quantities.

A preferred aspect of a method of manufacturing a phase change memory device of the invention includes a first step of embedding a conductive material in a through hole formed in an interlayer insulating film to form a heater electrode, a second step of forming an insulating film on the interlayer insulating layer, forming a landing electrode layer on the insulating film, patterning the landing electrode layer and the insulating film successively using a common mask, and exposing at least part of the upper surface of the heater electrode and part of the interlayer insulating film, a third step of forming a phase change layer to cover the landing electrode layer, exposed heater electrode, and the insulating film, a fourth step of patterning the phase change layer so that the phase change layer and part of the landing electrode layer are brought into face contact with each other near the heater electrode, and that the landing electrode layer is exposed in a portion off from the face contact portion, and a fifth step of forming an interlayer insulating layer on the phase change layer and the landing electrode layer, forming a through hole reaching the portion where the landing electrode layer is exposed, and further forming a contact electrode directly contacting the landing electrode via the through hole. The method of manufacturing a phase change memory device of the invention is based on basic techniques for manufacturing process of silicon-based LSI, and does not need any special steps. Accordingly, it is possible to produce a large scale of phase change memory device of the invention in quantities with ease without undue processing.

In another preferred aspect of the method of manufacturing a phase change memory device of the invention, when the landing electrode layer and insulating film are patterned successively in the second step, due to a difference in etching rate between the layer and the film, the cross section of the patterned landing electrode layer is substantially perpendicular, and the cross section of the patterned insulating film has a tilting shape, whereby it is automatically achieved that an end portion of the landing electrode layer is positioned in a portion off from a portion immediately above a contact portion between the phase change layer and the heater electrode. In the phase change memory device of the invention, the positional relationship between a position of the heater electrode and a position of the end portion of the landing electrode layer is very important. In other words, the landing electrode layer should not exhibit good contact between the heater electrode and the phase change layer. Meanwhile, when the end portion of the landing electrode layer is spaced too distance apart from near the contact face of the heater electrode and the phase change layer, the demand for reduction in the size of a memory cell is not met. Therefore, the positioning technique so-called self alignment is adopted where relative positions of the peak electrode and the end portion of the landing electrode are automatically determined. In other words, in patterning the insulating film on the interlayer insulating layer with the heater electrode embedded therein, using a common mask, the landing electrode layer is processed, and then, the insulating film is selectively removed successively to form an opening. At this point, since an etching rate of the landing electrode layer is high, the cross section of the processed portion of the landing electrode is substantially perpendicular. On the other hand, since an etching rate of the insulating film is low (while re-growth of the insulating film concurrently proceeds during etching), the cross section of the processed portion of the insulating film has a tapered (slant) shape. By this means, the contact face of the heater electrode and phase change layer is formed apart from the end portion of the landing electrode layer by a distance such that the insulating film has the slant shape and thus extends in the horizontal direction. Accordingly, the positional relationship between the end portion of the landing electrode layer and the contact face of the heater electrode and phase change layer is automatically determined, the problem does not arise in positioning, and manufacturing of minute phase change memory device is facilitated.

In another preferred aspect of the method of manufacturing a phase change memory device of the invention, the landing electrode layer is formed via a step of forming a main electrode layer and another step of forming an adhesion layer on the main electrode layer to improve adhesion with the phase change memory layer. The adhesion between the phase change layer and landing electrode layer can be improved by providing the adhesion layer (titanium (Ti) or the like) on the main electrode layer (for example, metal layer of tungsten (W) or the like) that is a structural element of the landing electrode layer. Since the adhesion layer does not contact the phase change layer in a region where phase transition occurs, the problem as in the conventional structure does not arise that components of both layers are bonded in the region where phase transition occurs and that the composition changes, and therefore, the rewritable characteristics are not affected.

In another preferred aspect of the method of manufacturing a phase change memory device of the invention, in the second step, an opening pattern formed in the memory cell area to expose at least part of the upper surface of the heater electrode and part of the interlayer insulating film is provided over two adjacent heater electrodes. A long slim opening pattern is naturally formed by forming an opening pattern across two adjacent heater electrodes. Accordingly, as compared with the case of forming a single circular pattern (with a small area to expose only the top face of a single heater), formation of the opening pattern (step of processing the landing electrode layer and insulating film successively) is facilitated. In other words, in the case of a single circular pattern, if a large positional deviation occurs between the opening pattern and heater electrode, the probability is high that a situation (contact failure) occurs where the top face of the heater electrode is not exposed at all. In contrast thereto, in the case of a long slim opening pattern, if a large positional deviation occurs between the opening pattern and heater electrode in the longitudinal direction, since the opening extends in the lateral direction, the risk is reduced that a situation (contact failure) occurs where the top face of the heater electrode is not exposed at all. Thus, a margin of positioning of the mask (allowance for positioning) is increased in forming an opening pattern, and as a result, formation of the opening pattern is facilitated.

In another preferred aspect of the method of manufacturing a phase change memory device of the invention, formed is one of an insulating gate type field-effect transistor, bipolar transistor and diode that are electrically connected to the heater layer, and performed then are the first to fifth steps that are steps of manufacturing the phase change memory element. After forming a switching element such as the insulating gate type field-effect transistor, bipolar transistor or diode (including a Schottky diode as well as a junction diode), the phase change memory element of the invention is formed and a memory cell is thus formed. Further, by forming a peripheral circuit including the address circuit, the phase change memory LSI is produced.

In still another preferred aspect of the method of manufacturing a phase change memory device of the invention, in the second step, the insulating film and landing electrode layer are formed in a region to form a peripheral circuit as well as a region to form the memory cell, and when the landing electrode layer and insulating film are patterned successively, patterning is also performed on the region to form the peripheral circuit, whereby an electrode layer or wiring layer with a predetermined pattern is formed also in the region to form the peripheral circuit. In the structure of the conventional phase change memory element, the upper electrode and the phase change layer cannot be divided in integration, and it is not possible to share the step of forming the electrode and the like in the peripheral circuit only with the step of forming the upper electrode. However, in the phase change memory element of the invention, the landing electrode layer (metal layer of tungsten (W) or the like) is provided in manufacturing process independently of the phase change layer. Accordingly, it is made possible to form the electrode and wiring in a peripheral circuit concurrently with formation of the landing electrode layer in a memory cell, and the manufacturing process can be shared. It is thereby possible to facilitate manufacturing of a large scale of phase change memory LSI.

BRIEF DESCRIPTION OF THE DRAWING

FIG. 21 is a view showing part of the periodical table to explain chalcoge elements;

DESCRIPTION OF THE PREFERRED EMBODIMENTS

Before explaining specific embodiments of the invention, described below are problems of the phase change memory device with the conventional structure clarified by the inventor of the invention prior to the invention.

Described first is the structure of the phase change memory device examined by the inventor of the invention prior to the invention.

Figure 19:
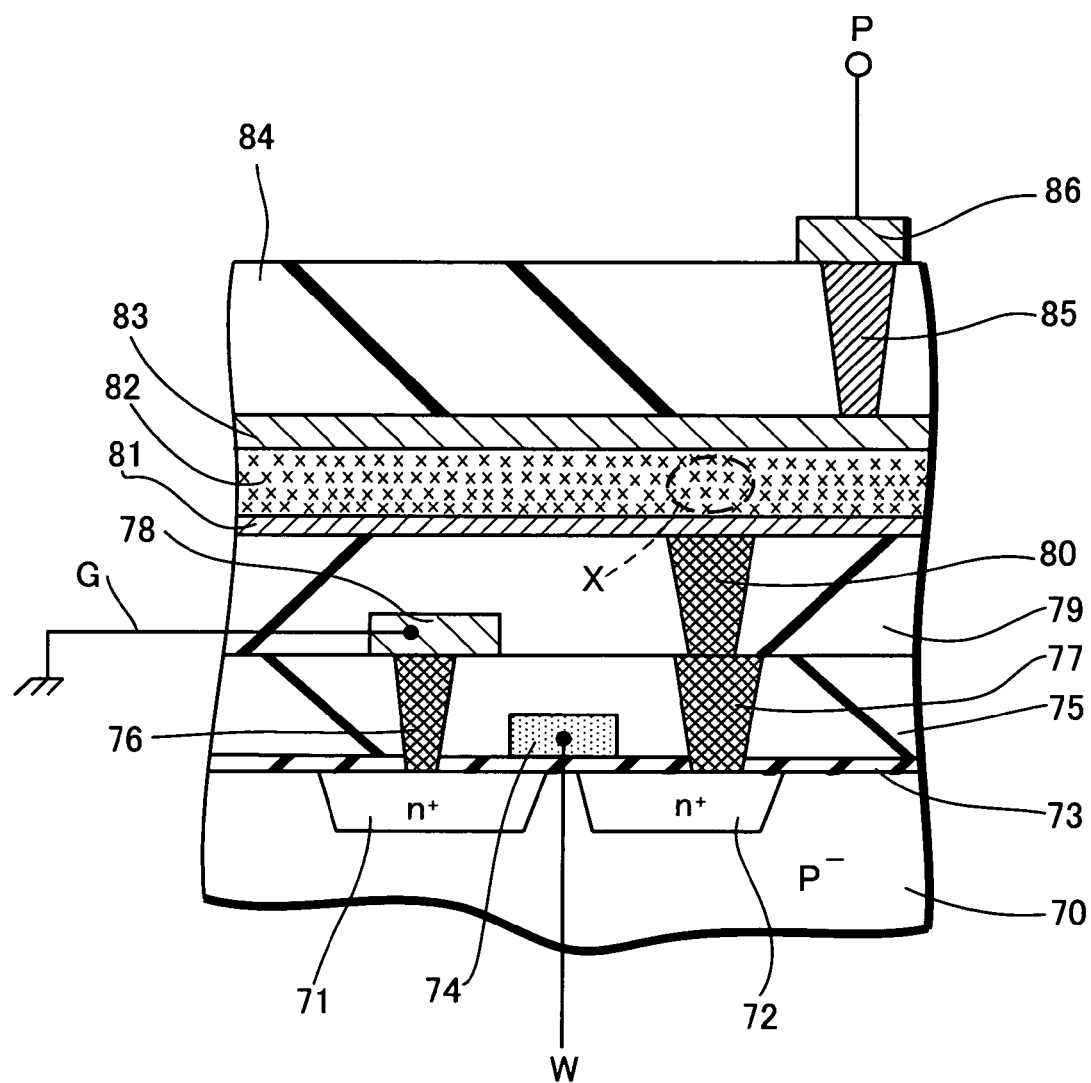
FIG. 19 is a cross-sectional view of a device showing a structure of a memory cell portion of a phase change memory device examined by the inventor of the invention prior to the invention.

FIG. 19 is a cross-sectional view of a device showing a structure of a memory cell portion of the phase change memory device examined by the inventor of the invention.

In FIG. 19, n-type layers 71 and 72 (source layer 71 and drain layer 72) are formed in a p-type semiconductor substrate 70, and a gate electrode 74 (connected to a word line W) is provided on a gate insulating film 73.

Reference numerals 75 and 79 denote interlayer insulating films. To the n-type layer 71 are connected electrodes (i.e. embedded electrode 76 passed through the interlayer insulating film 75 and electrode 78 comprised of a first conductor layer), and the electrodes are connected to a ground line G.

To the n-type layer 72 is connected an embedded electrode 77 passed through the interlayer insulating film 75, and the embedded electrode 77 is connected to an embedded electrode 80 (heater electrode) passed through the interlayer insulating film 79.

Reference numeral 82 denotes a phase change layer comprised of a chalcogenide alloy. Reference numeral 81 denotes an adhesion layer comprised of an extremely thin metal film. The adhesion between the chalcogenide alloy layer 81 and interlayer insulating film 79 is regarded as being not excellent, and therefore, to improve the intensity of adhesion therebetween, the adhesion layer 81 is provided.

Reference numeral 83 denotes an upper electrode which is comprised of a second conductor layer and provided to cover the top face of the phase change layer 82. Reference numeral 84 denotes an interlayer insulating film. The upper electrode 83 is provided with an embedded electrode 85 passed through the interlayer insulating film 84, and the embedded electrode 85 is connected to an electrode 86 (used as a pulse supply terminal P) comprised of a third conductor layer. The embedded electrode 85 and electrode 86 comprised of the third conductor layer constitute a contact electrode.

In FIG. 19, an area surrounded by bold dotted line X in the phase change layer 82 is a region where phase transition occurs. The electrode 80 embedded in the interlayer insulating film 79 concentrates the current passed through the phase change layer 82 to increase the current density, results in action for contributing to efficient generation of Joule heat in the phase change area X, and thereby is called a heater electrode (heating electrode) (hereinafter, referred to as the heater electrode). The current density of the current passed through the phase change layer 82 increases as the contact area between the heater electrode 80 and phase change layer 82 decreases, and due to the increases, generated Joule heat increases. Accordingly, the contact area between the heater electrode 80 and phase change layer 82 is designed to be adequately narrow (for example, an area determined by the minimum design dimensions of photolithography).

Figure 20:
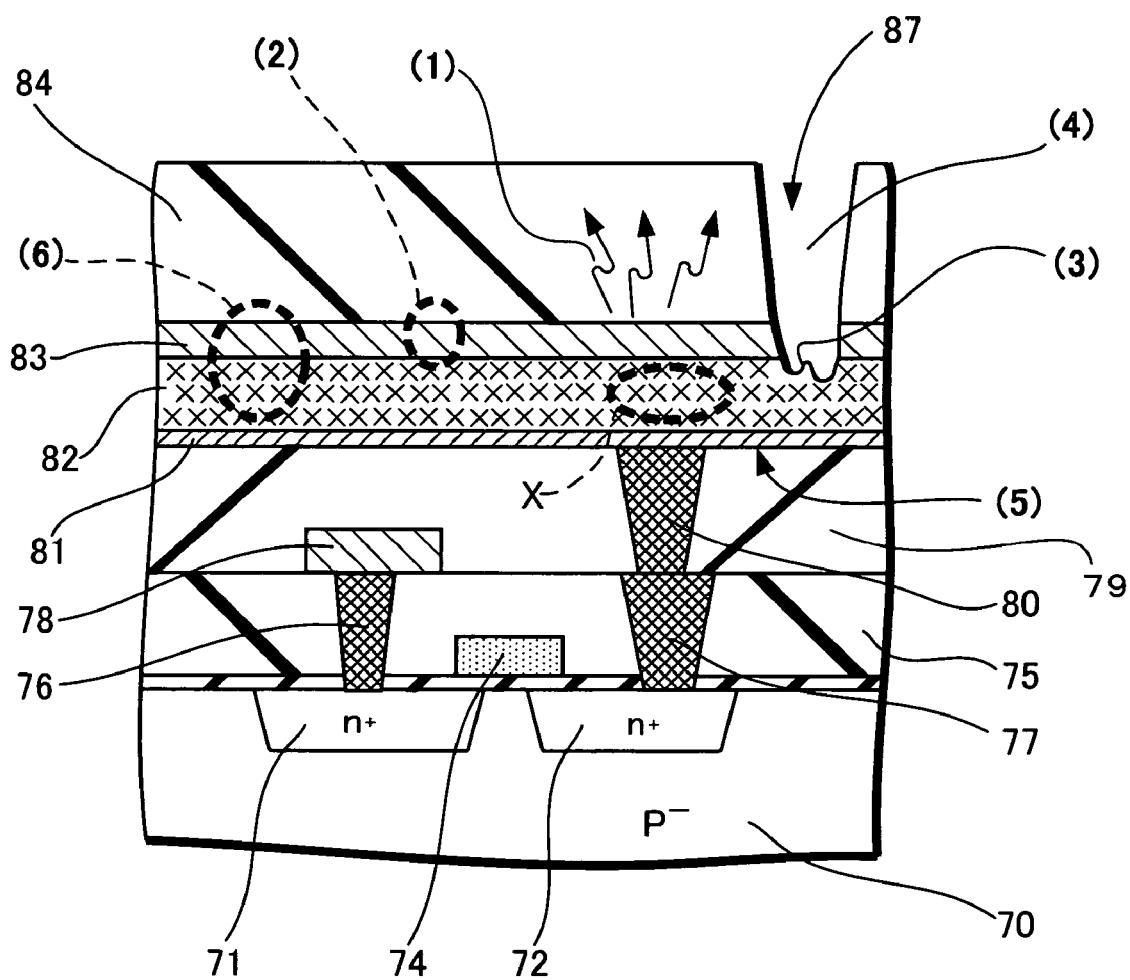
FIG. 20 is a cross-sectional view of the device to explain the inconvenience in mass production of the phase change memory device with the structure as shown in FIG. 19.
Figure 22A:
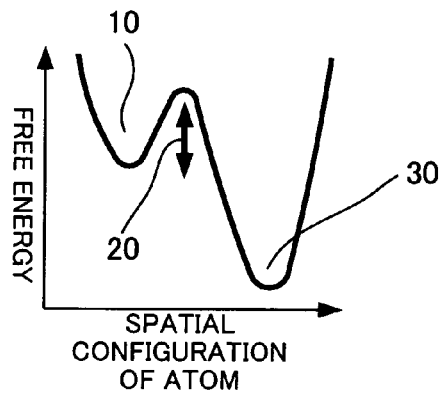
FIGS. 22A and 22B are views to explain the principle of phase change memory.
Figure 22B:
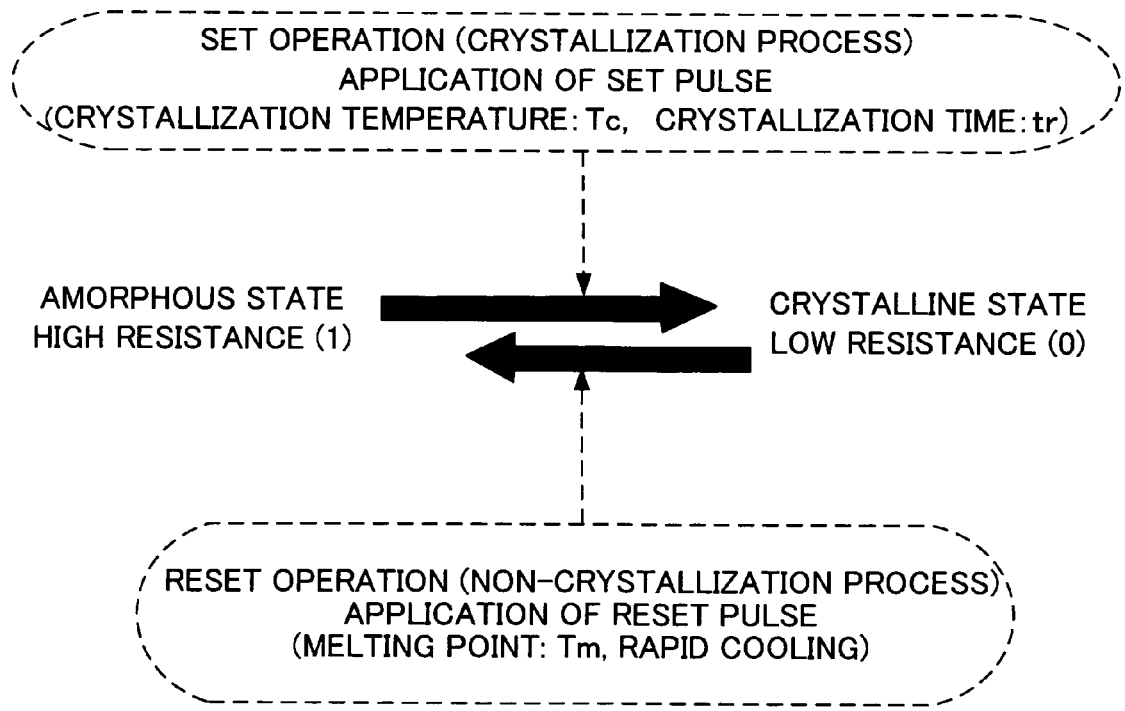
Figure 23A:
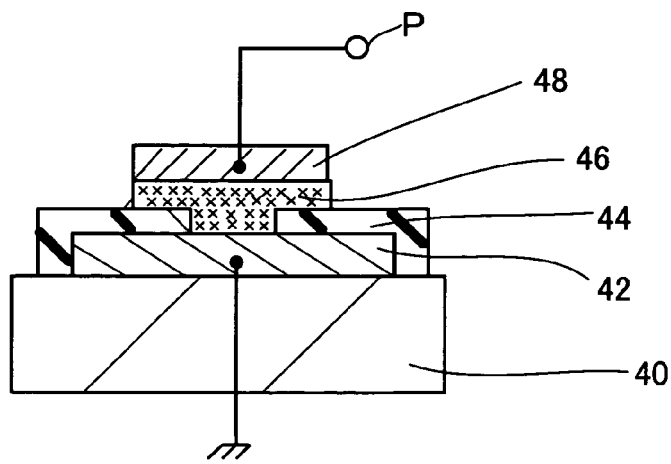
FIGS. 23A to 23D are views to explain a basic structure of the phase change memory element and set/reset operation of the phase change memory element.
Figure 23B:
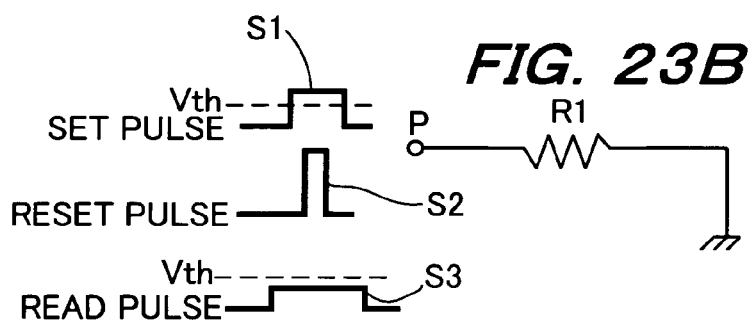
Figure 23C:
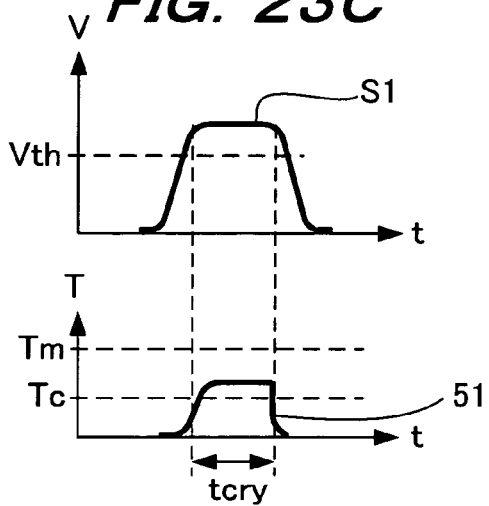
Figure 23D:
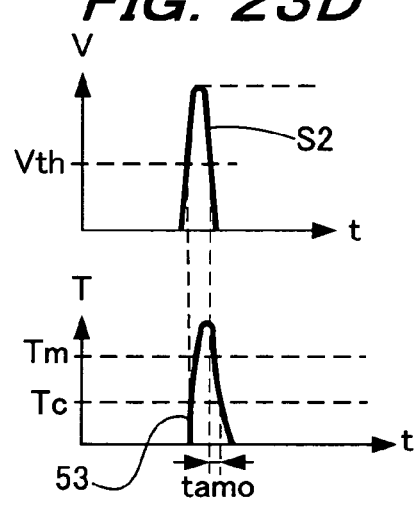
Figure 24:
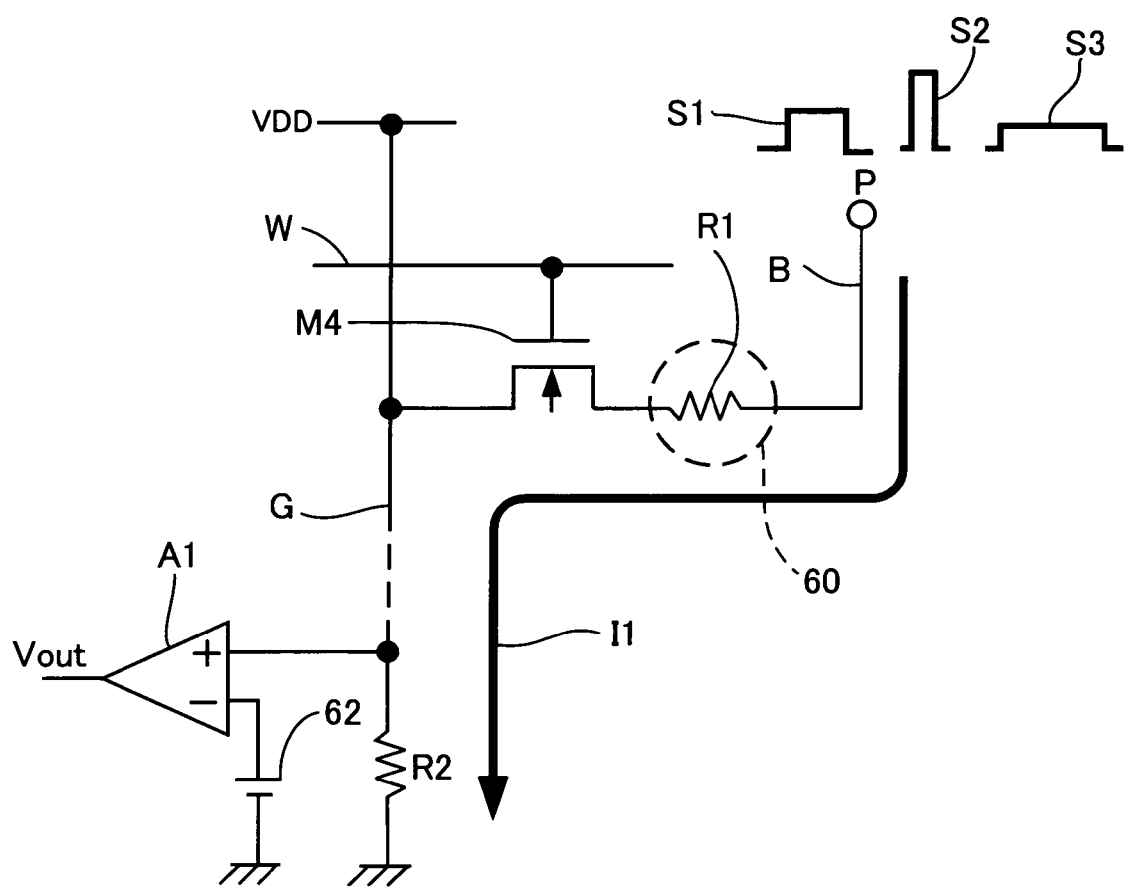
FIG. 24 is a circuit diagram to explain read operation in the phase change memory device (phase change memory LSI).

The inventor of the invention examined the phase change memory device with the structure as shown in FIG. 19 from various viewpoints, and as a result, found that following inconveniences can occur. In addition, FIG. 20 is referred to as appropriate in following descriptions. FIG. 20 is a cross-sectional view of a device to explain the inconveniences (results of the examination by the inventor of the invention) in mass production of the phase change memory device with the structure as shown in FIG. 19. In FIG. 20, common portions to those in FIG. 19 are assigned the same reference numerals.

As described above, the conventional phase change memory device typically adopts a structure where a phase change layer (for example, GST film) is sandwiched between upper and lower electrodes. In other words, electrodes exist on and under the phase change layer. This means that the upper electrode always exits on the phase change area of the phase change layer. The upper electrode (upper metal layer made of metal such as tungsten or the like) also has heat radiation characteristics, and therefore, the conventional phase change memory device is regarded as having a structure such that a radiating fin is formed immediately above the phase change area.

As described above, since phase transition of the chalcogenide alloy layer is implemented by using Joule heat caused by applying the current, dissipation of the Joule heat via the upper electrode (upper metal layer) leads to a reduction in thermal efficiency and is not preferable.

The reduction in thermal efficiency does not become a significant problem at the prototyping stage of discrete phase change memory element and phase change memory LSI with a low degree of integration, but becomes a serious problem at the actual mass production stage of phase change memory elements with a high degree of integration using the fine patterning processing.

In other words, to increase the capacity of the phase change memory element, it is required to decrease the size of the memory cell, and therefore, a reduction in reset current (that is to restore the phase change layer from the crystalline state to amorphous state) is an important issue. In the structure where a metal layer is laminated on the phase change layer and the upper metal layer functions as a radiating fin, the thermal efficiency deteriorates in writing (particularly, in reset), resulting in a factor for prohibiting the reduction in the current amount of the reset current. It is thus not possible to achieve a large scale of phase change memory LSI.

In other words, since the upper metal layer (reference numeral 83 in FIG. 20) acting as a radiating fin exits immediately above the phase change layer (area X surrounded by bold dotted line in FIG. 20), such an inconvenience occurs that the thermal efficiency deteriorates (Problem (1) shown in FIG. 20).

Further, since the upper metal layer (reference numeral 83 in FIG. 20) has a predetermined thickness, the heat also escapes from the side portion of the upper metal. Accordingly, decreasing the thickness of the upper metal layer is considered to suppress dissipation from the upper metal layer as much as possible. However, the decrease in the thickness of the upper metal layer makes the cross-sectional area smaller, increases the wiring resistance, and results in deterioration in circuit characteristics (Problem (2) shown in FIG. 20).

Furthermore, the upper metal layer (reference numeral 83 in FIG. 20) acts as an etching stopper in making an opening for a contact hole (reference numeral 87 in FIG. 20) in the interlayer insulating film, and prevents the undercoated phase change layer (for example, GST film: reference numeral 82 in FIG. 20) from being exposed. Accordingly, when the upper metal layer (reference numeral 83 in FIG. 20) is thinned, informing the contact hole (reference numeral 87 in FIG. 20) in the interlayer insulating film by etching, a risk occurs that the upper metal layer is penetrated, the phase change layer (for example, GST) is exposed, and components of the phase change layer are volatilized and pollute the line (Problem (3) shown in FIG. 20).

Still furthermore, when the phase change layer (for example, GST: reference numeral 82 in FIG. 20) is partially exposed, such a problem may arise that components of the phase change layer are sublimated and disappear by heat treatment subsequently performed in embedding the metal layer to be contact electrodes. Further, it is feared that component gases of the phase change layer fill the contact hole, an adequate amount of metal gas to form the contact electrode cannot reach the inside of the contact hole, and failure occurs in growth of the embedded electrode (Problem (4) shown in FIG. 20).

Moreover, as described previously, the adhesion between the phase change layer (reference numeral 82 in FIG. 20) and interlayer insulating film (reference numeral 79 in FIG. 20) is regarded as being not good. The case thereby arises that an adhesion layer (reference numeral 81 in FIG. 20) comprised of an extremely thin film of metal such as titanium (Ti) or the like is provided between the layer and film. In this case, as can be seen from FIG. 20, since the adhesion layer (Ti or the like) 81 contacts the bottom of the phase change layer (for example, GST film) 82, the case may occur that components of both layers are bonded (for example, Ti (titanium) and Te (tellurium) are bonded), and that the composition of the phase change layer 82 changes near the contact face between the layer 82 and adhesion layer 81, and has an adverse effect on rewritable characteristics of the phase change layer (Problem (5) shown in FIG. 20).

In manufacturing an LSI, it is important to share the manufacturing process to efficiently manufacture the LSI. Herein, noting the upper metal layer (reference numeral 83) as shown in FIG. 20, the upper metal layer 83 has conventionally been used only as an upper electrode of the memory cell portion. If the upper metal layer 83 can be used as wiring and electrode in the peripheral circuit (including an address circuit, pulse supply circuit, sense amplifying circuit and the like), such use is preferable to implement sharing of the manufacturing process.

However, in the phase change memory element with the structure as shown in FIG. 20, the upper metal layer 83 needs to be always provided to cover the top face of the phase change layer (GST or the like) 82. In other words, the upper metal layer 83 and the phase change layer 82 (GST or the like) are paired, and cannot be divided in integration. Accordingly, it is not possible to use only the upper metal layer 83 in forming wiring and electrodes in the peripheral circuit. Therefore, in forming wiring and electrodes in the peripheral circuit, independently of processes of forming and processing a metal layer in a memory cell portion, it is necessary to newly add processes of forming and processing a metal layer, and the manufacturing process cannot be simplified (Problem (6) in FIG. 20).

Thus, the phase change memory device with the conventional structure has a plurality of problems having adverse effects on mass production of a large scale of phase change memory LSI (i.e. reduction in thermal efficiency by heat dissipation from the upper metal layer (Problem (1)); increase in resistance due to thinned upper metal (Problem (2)); line pollution and/or disappearance of part of the phase change layer caused by the fact that the upper metal layer is penetrated in forming the contact hole and the phase change layer is exposed (Problem (3)); failure in growth of the embedded electrode (Problem (4)); change in the composition caused by bonding of compositions of the adhesion layer and phase change layer (Problem (5)); and the upper metal layer unused as wiring or the like of the peripheral circuit (Problem (6)). Accordingly, it is desired to establish the technique for mass production of a large scale of phase change memory LSI.

The present invention has been carried out based on the result of above-mentioned studies made by the inventor of the invention. According to the invention, a phase change memory device is achieved that has a structure with high thermal efficiency in writing (particularly, in reset), and it is made possible to produce a large scale of phase change memory LSI in large quantities while solving the above-mentioned problems.

Embodiments of the present invention will specifically be described below with reference to accompanying drawings.

First Embodiment

Figure 1:
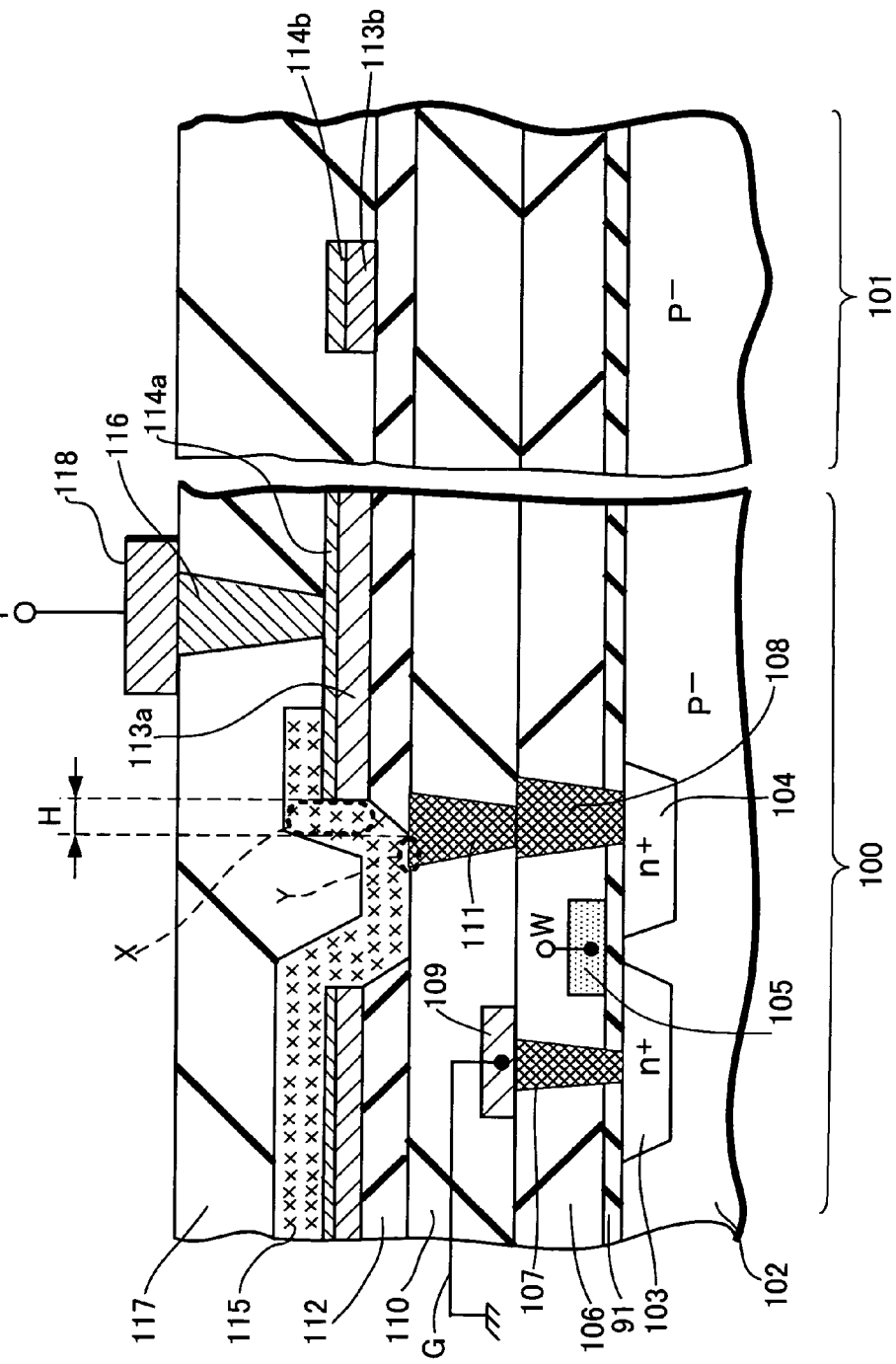
FIG. 1 is a cross-sectional view showing a structure of principal part of an example of a phase change memory device (including a phase change memory element and peripheral circuit) of the present invention.

FIG. 1 is a cross-sectional view of a device showing a structure of principal part of an example of a phase change memory LSI (including a phase change memory element and peripheral circuit) of the present invention.

In FIG. 1, an area 100 is a memory cell area, and an area 101 is a peripheral circuit area. The memory cell area 100 is to form a plurality of memory cells comprised of a phase change memory element and MOS transistor. The peripheral circuit area 101 is to form an address circuit, pulse supply circuit, sense amplifying circuit and the like.

In the memory cell 100, n-type layers 103 and 104 (specifically, source layer 103 and drain layer 104) are formed in a p-type semiconductor substrate 102, and a gate electrode 105 (connected to a word line W) comprised of doped polysilicon or the like is provided on a gate insulating film 91.

Reference numerals 106 and 110 denote interlayer insulating films. To the n-type layer 103 constituting part of the MOS transistor are connected an embedded electrode 107 penetrating the interlayer insulating film 106 and a first-layer electrode 109 comprised of a first metal layer (for example, tungsten (W)), and the first-layer electrode 109 is connected to a ground line G. In following descriptions, the first-layer electrode 109 is referred to as the first metal layer as appropriate.

To the n-type layer 104 constituting part of the MOS transistor is connected an embedded electrode 108 penetrating the interlayer insulating film 106, and the embedded electrode 108 is connected to a heater electrode 111 penetrating the interlayer insulating film 110.

An insulating film (CVD-SiO$_2$ film) 112 is formed on the interlayer insulating film 110, the insulating film 112 is patterned, and an opening is provided to expose the top face of the heater electrode 111.

On the insulating film 112 is provided a landing electrode layer comprised of a main electrode material layer 113a made of tungsten (W) and an adhesion layer 114a made of titanium (Ti). The landing electrode layer (113a and 114a) is processed in a predetermined pattern shape.

The adhesion layer 114a is not an indispensable structural element, but by providing the adhesion layer 114a, the adhesion between the phase change layer 115 and landing electrode layer (113a and 114a) is improved, and it is possible to reliably dissolve the problem of peeling of the phase change layer. In following descriptions, the landing electrode layer (113a and 114a) is referred to as a second metal layer as appropriate.

When the landing electrode layer (113a, 114a: second metal layer) is formed in the memory cell portion 100 and patterned, also in the peripheral circuit area 101, the second metal layer (113a and 114a) is formed and patterned, whereby an electrode layer and wiring layer are formed in the peripheral circuit area 101. In other words, formation of the landing electrode (113a and 114a) in the memory cell area 100 and formation of the electrode and wiring (113a and 114a) in the peripheral circuit area 101 is performed at the same time, and the sharing of the manufacturing step is thereby achieved. The reason why such sharing of the manufacturing step can be implemented is that in the case of the phase change memory element of the invention, the landing electrode layer (113a, 114a: second metal layer) is independent in manufacturing process of a phase change layer (GST) 115.

On the insulating film 112 is formed the phase change layer 115 made of GST with a predetermined pattern. The phase change layer (GST) 115 is formed to cover over an opening (i.e. partially exposed heater electrode 111 and interlayer insulating film 110) of the insulating film 112 while being stacked on the landing electrode layer (113a and 114a) to partially overlap.

In the figure, an area X surrounded by bold dotted line is an area (phase change area) where phase transition occurs by Joule heat. An area Y similarly surrounded by bold dotted line shows a contact face of the phase change layer (GST) 115 and heater electrode 111. To increase the current density to efficiently generate Joule heat, it is necessary to decrease the area of the contact face of the phase change layer (GST) 115 and heater electrode 111. Accordingly, the phase change layer (GST) 115 only contacts part of the top face of the heater electrode 111, instead of the entire top face.

Herein, a point to be noted is that the upper electrode acting as a radiating fin does not exist immediately above the phase change area X unlike in the conventional structure, and the thermal efficiency is thereby enhanced in phase change treatment.

Further, another point to be noted is that an end portion of the landing electrode layer (113a, 114a: second metal layer) is formed apart "H" in the horizontal direction from an end portion of the contact face (Y) of the heater 111 and phase change layer 115. The processed portion of the insulating film 112 has a cross section in slant-shape, and corresponding to the distance (H) such that the slant extends in the horizontal direction, both portions are automatically formed apart from each other. In other words, relative positions of both portions are determined in a self-alignment manner, and positioning with high accuracy can thereby be made (this point will specifically be described later in explaining the manufacturing process.)

An interlayer insulating film 117 is provided on the phase change layer 115, and a contact hole is provided in a portion off from a portion immediately above the heater electrode 111 in the interlayer insulating film 117. Then, a contact electrode (comprised of an embedded electrode 116 and third metal layer 118) is directly connected to the landing electrode layer (113a, 113b) via the contact hole. Herein, a point to be noted is that the phase change layer (GST) 115 does not exist immediately below the contact electrode (116 and 118), and any conventional problems do not arise that components of the phase change layer (GST) 115 are sublimated and disappear.

According to the phase change memory element with the structure as shown in FIG. 1, problems (1) to (6) of the conventional phase change memory element as shown in FIG. 20 are all dissolved, and it is possible to implement the phase change memory element with a basic structure which is high in thermal efficiency and suitable for a large-scale device.

In other words, in the phase change memory element as shown in FIG. 1, an electrode acting as a radiating fin does not exist immediately above the phase change area (X) of the phase change layer 115, Joule heat generated by the current is thereby not dissipated via the electrode unlike in the conventional structure, and the thermal efficiency is improved in phase change treatment. Accordingly, it is possible to reduce the reset current and decrease the memory cell size.

Further, since the upper electrode as in the conventional structure does not exist, the thickness does not become the problem, the landing electrode layer (113a and 114a) with a sufficient thickness can be formed without any problems in the phase change memory element of the invention, and it is thereby possible to decrease the wiring resistance.

Furthermore, since the phase change layer 115 made of GST does not exist immediately below the contact electrode (116 and 118), any problems do not arise such as pollution due to exposure of the phase change layer in forming an opening for the contact hole, sublimation and disappearance of part of the phase change layer, and occurrence of failure in embedding the contact hole.

Still furthermore, the bottom of the phase change layer 115 contacts the landing electrode layer (113a, 114a: second metal layer), and the adhesion is improved as compared with the conventional structure where the phase change layer contacts the insulating film. This respect is advantageous from the viewpoint of improvement in reliability of the phase change memory element.

Moreover, even when the adhesion layer 114a comprised of a thin film of titanium (Ti) or the like is formed on the landing electrode layer (113a and 114a) to improve the adhesion, since the adhesion layer does not contact the phase change layer in a region where phase transition occurs in the phase change memory element of the invention, the problem as in the conventional structure does not arise that components of both layers are bonded in the region where phase transition occurs and that the composition changes, and therefore, the rewritable characteristics are not affected.

Further, in the phase change memory element as shown in FIG. 1, by varying patterns of the landing electrode layer (113a and 114a), it is possible to freely change a formation position of the contact electrode (116 and 118), and flexibility in design of layout is improved.

Thus, the phase change memory element in FIG. 1 has many advantages that the thermal efficiency is high, the problems in the structure or manufacturing process feared in the conventional structure are all solved, the manufacturing steps can be shared, and that flexibility in design of layout is high. Accordingly, it is possible to perform stable mass production of a large scale of phase change memory LSI.

Furthermore, the phase change memory element in FIG. 1 can be manufactured only by basic techniques for manufacturing process of silicon-based LSI, and mass production can be achieved with ease.

Still furthermore, in the phase change memory element as shown in FIG. 1, the landing electrode layer (113a and 114a) is provided in manufacturing process independently of the phase change layer 115. Accordingly, it is made possible to form the electrode and wiring (113b and 114b) in the peripheral circuit area (101) concurrently with formation of the landing electrode layer (113a and 114a) in the memory cell area 100. Accordingly, the manufacturing process can be shared. It is thereby possible to facilitate manufacturing of a large scale of phase change memory LSI.

Moreover, using a common mask, the landing electrode layer (113a and 114a) and insulating film 112 are patterned successively, and the processed cross section of the insulating film 112 is formed in slant-shape, whereby suitable positioning of the heater electrode 111 and the end portion of the landing electrode (113a and 114a) can be made in self alignment, and manufacturing of minute phase change memory element is facilitated.

Second Embodiment

This embodiment specifically describes a configuration of circuitry of LSI using phase change memory elements with the basic structure as shown in FIG. 1, its layout, and process of manufacturing the device.

Figure 2:
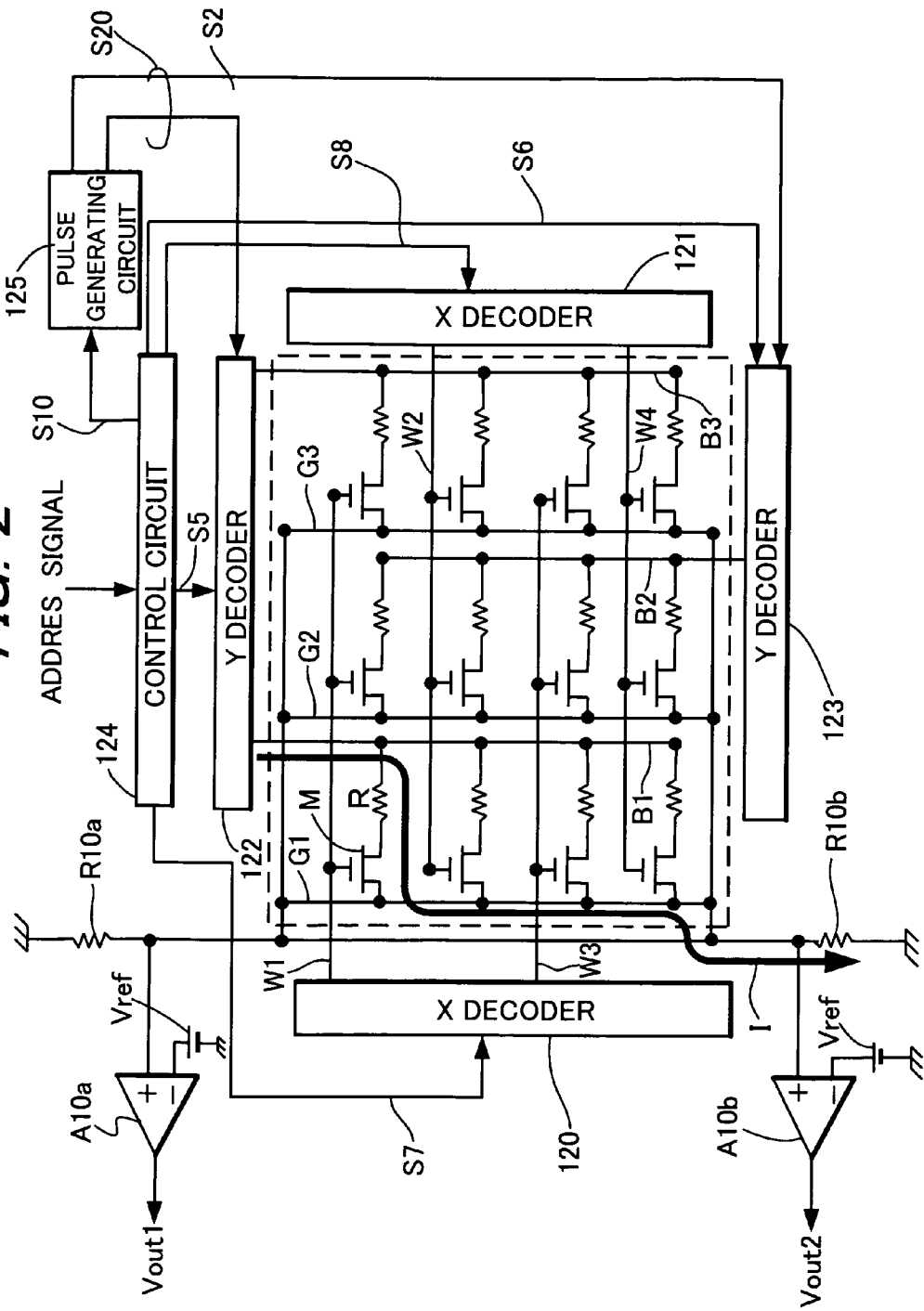
FIG. 2 is a diagram illustrating a structure of the entire circuitry of an example of the phase change memory device (memory LSI) of the invention.

FIG. 2 is a circuit diagram illustrating a structure of the entire circuitry of an example of the phase change memory LSI of the invention.

As shown in the figure, in the center portion of the phase change memory LSI is disposed a memory cell portion having matrix-shape arranged memory cells each comprised of an MOS transistor (M) for element selection and the phase change memory element (expressed by equivalent resistance R in the figure) of the invention.

In the figure, G1 to G3 are ground lines, W1 to w4 are word lines, and B1 to B3 are bit lines.

X decoders 120, 121 and Y decoders 122, 123 constitute the address circuit. The X decoders 120, 121 drive the word lines W1 to W4. The Y decoders 122, 123 drive the bit lines B1 to B3.

A control circuit 124 totally controls the operation of the phase change memory LSI. The control circuit 124 supplies control signals S5 to S8 respectively to the Y decoders 122, 123 and X decoders 120, 121, and controls the operation of each of decoders (120 to 123) separately.

According to the control signal S10 from the control circuit 124, a pulse generating circuit 125 generates various pulse signals (set pulse, reset pulse and read pulse) S20 to supply to the Y decoders 122 and 123.

In FIG. 2, each of A10a and A10b denotes an operation amplifier constituting a sense circuit. R10a and R10b are current/voltage transform resistances to transform a current I (shown by bold solid arrow in FIG. 2) into a voltage. In addition, Vref is a reference voltage, and Vout1 and Vout2 are detection signals (read signals) of the phase change memory LSI.

Figure 3:
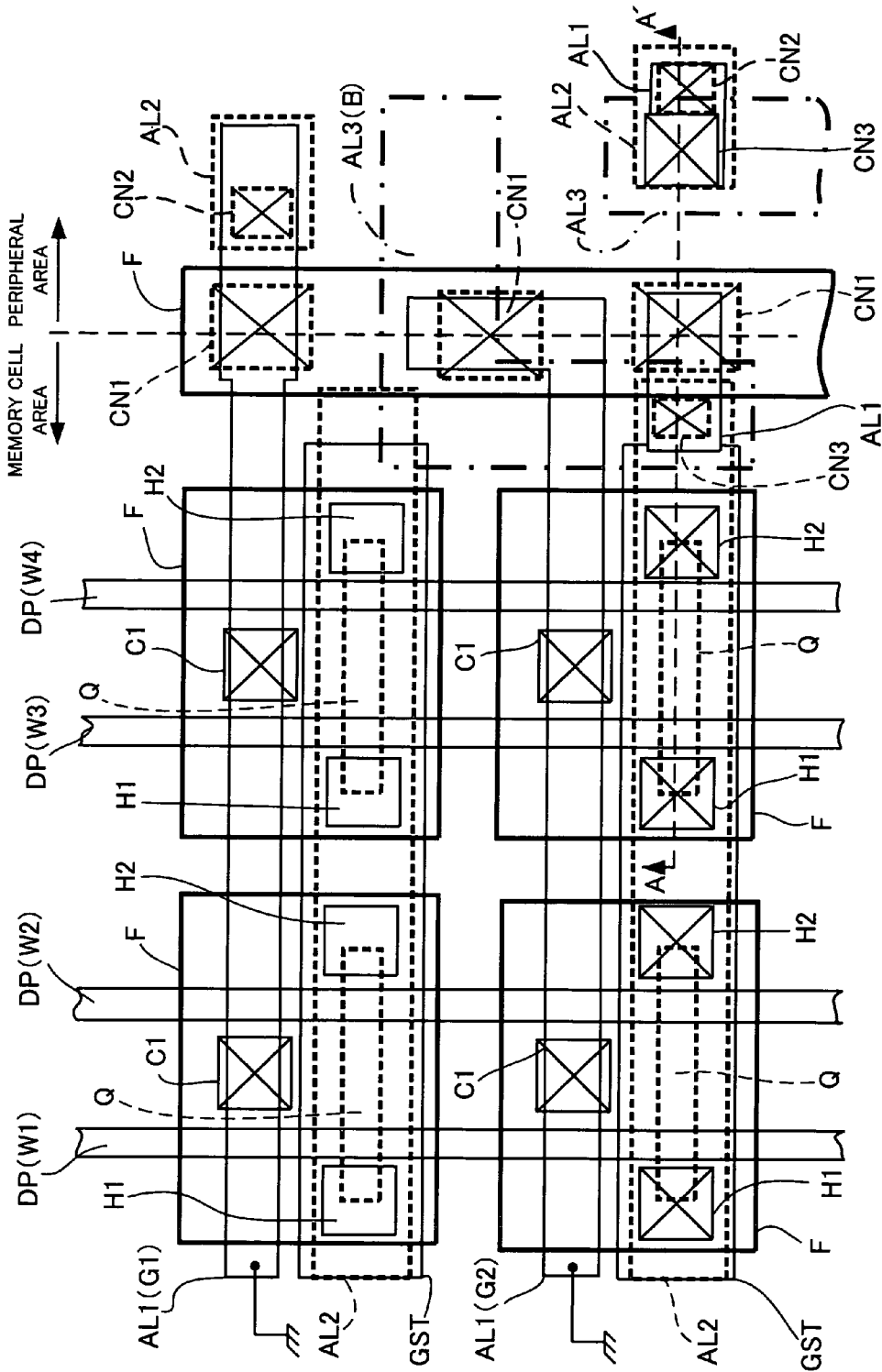
FIG. 3 is a plan view showing an example of a layout of elements and wiring in a memory cell area and an example of a layout of elements and wiring in a peripheral circuit area in the phase change memory LSI shown in FIG. 2.

FIG. 3 is a plan view showing an example of a layout of elements and wiring in the memory cell area and an example of a layout of elements and wiring in the peripheral circuit area.

An area F surrounded by bold solid line in FIG. 3 is a field area (element formation area). Further, in the memory cell area, each of four wiring lines (DP) disposed in the vertical direction is a doped polysilicon layer (which also serves as a gate electrode of the MOS transistor) constituting respective one of word lines (W1 to W4).

Similarly, in FIG. 3, two wiring lines (shown by thin solid line) AL1 disposed in the lateral direction indicate the first metal layer constituting the ground line (G1 and G2).

Further, GST indicates a GST film (corresponding to reference numeral 115 in FIG. 1) constituting the phase change layer.

AL2 (area shown by bold dotted line) indicates the second metal wiring layer constituting the landing wiring layer (113a and 114a in FIG. 1) and wiring and electrode (113b and 114b in FIG. 1) in the peripheral circuit area.

C1 indicates a contact area (ground contact) of the ground lines (G1 and G2) and the surface of the silicon substrate.

Each of H1 and H2 in the memory cell area is an area corresponding to the top face of the heater electrode (reference numeral 111 in FIG. 1). Similarly, Q indicates an opening area to expose part of the top face of the heater electrode (reference numeral 111 in FIG. 1) provided in the insulating film (reference numeral 112 in FIG. 1). In other words, in the end portion of the opening Q, GST is brought into contact with part of the top face of the heater electrode (111 in FIG. 1).

CN1 to CN3 shown near the peripheral area in FIG. 3 respectively indicate a contact area of the substrate and first metal layer, a contact area of the first and second metal layers, and a contact area of the second to third metal layers.

AL3 (shown by bold alternate long and short dashed lines) indicates the third metal wiring layer (corresponding to reference numeral 118 in FIG. 1).

Referring to FIGS. 4 to 17, described next are principal steps of manufacturing the phase change memory LSI as shown in FIG. 3.

Each of FIGS. 4 to 17 is a cross-sectional view of the device for each principal manufacturing step taken along line A-A' of FIG. 3.

Figure 4:
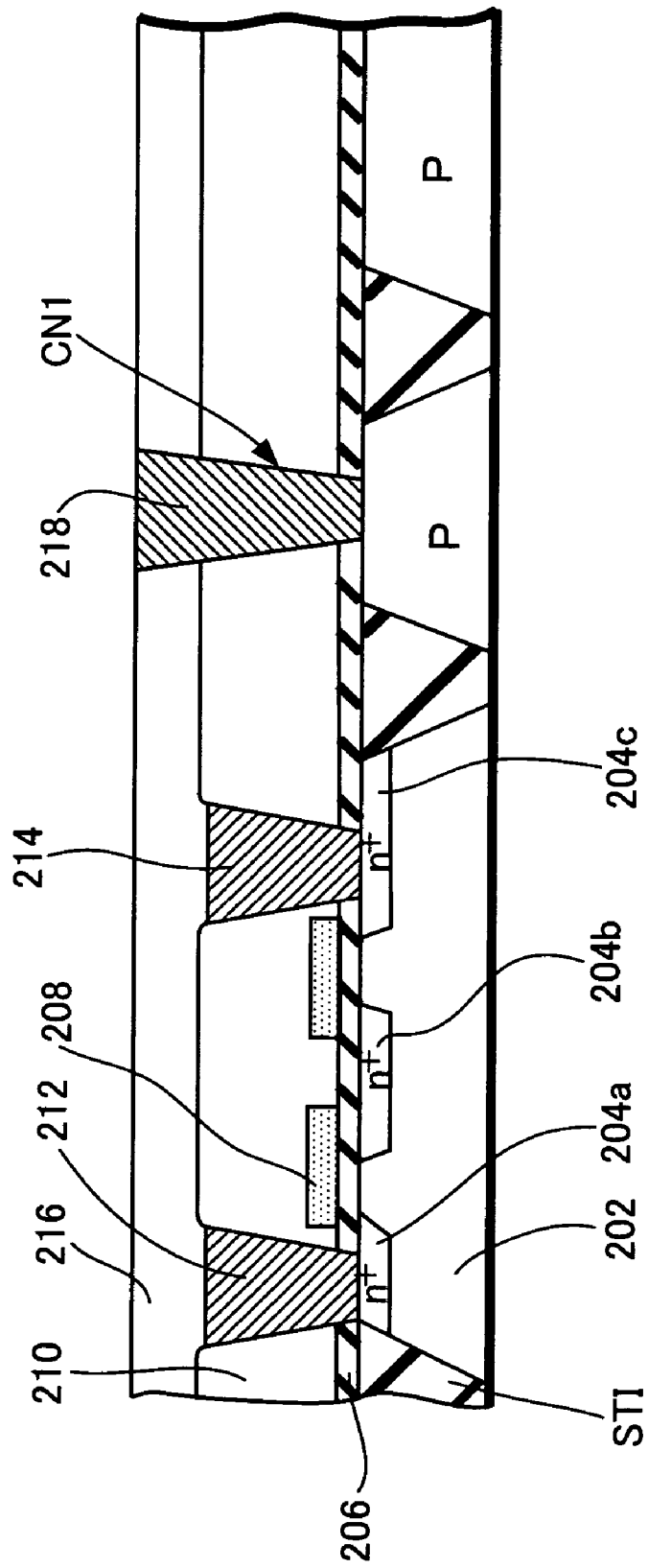
FIG. 4 is a cross-sectional view of the device in a first manufacturing step taken along line A-A' of FIG. 2.

In FIG. 4, shallow trench isolation (shown by STI in the figures) is formed in a p-type silicon substrate 202, and structural elements of an NMOS transistor are formed.

In other words, n-type diffusion layers 204*a* and 204*b* and gate insulating film 206 are formed, and further, a gate electrode (corresponding to the wiring layer DP constituting the word line W in FIG. 3) 208 is formed. Reference numerals 212 and 214 denote embedded electrodes (respectively corresponding to positions of H1 and H2 in FIG. 3) embedded in an interlayer insulating film 210. Reference numeral 218 denotes an embedded electrode embedded in a contact hole (CN1: see FIG. 3) formed to penetrate interlayer insulating films 210 and 216.

The embedded electrodes 212 and 214 are made of doped polysilicon, for example. The embedded electrode 218 is made of tungsten (W), for example. The interlayer insulating film 210 is a BPSG film (boron-doped phospho-silicate glass film) having a film thickness of about 500 nm, and the interlayer insulating film 216 is a P-TEOS (Plasma TEOS) oxide film having a film thickness of about 100 nm.

Figure 5:
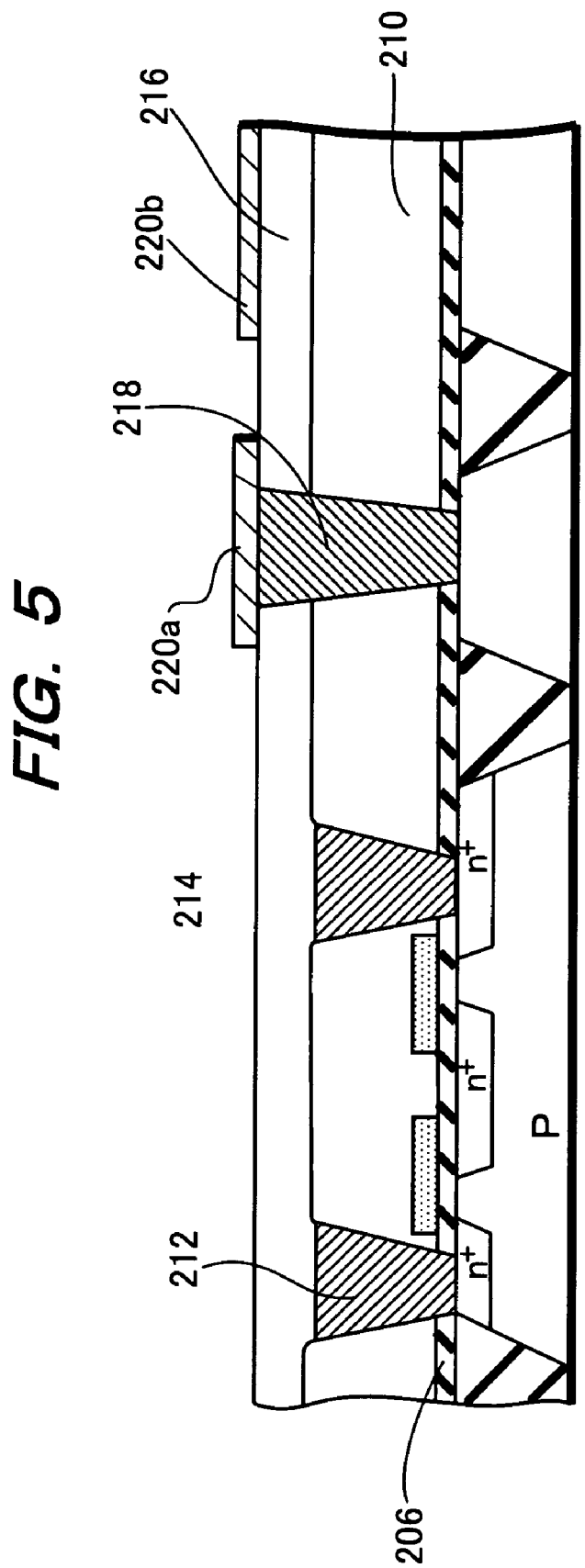
FIG. 5 is a cross-sectional view of the device in a second manufacturing step taken along line A-A' of FIG. 2.

In FIG. 5, the first metal layer (corresponding to AL1 in FIG. 3) 220*a* and 220*b* is formed. For example, the first metal layer is made of tungsten (W).

Figure 6:
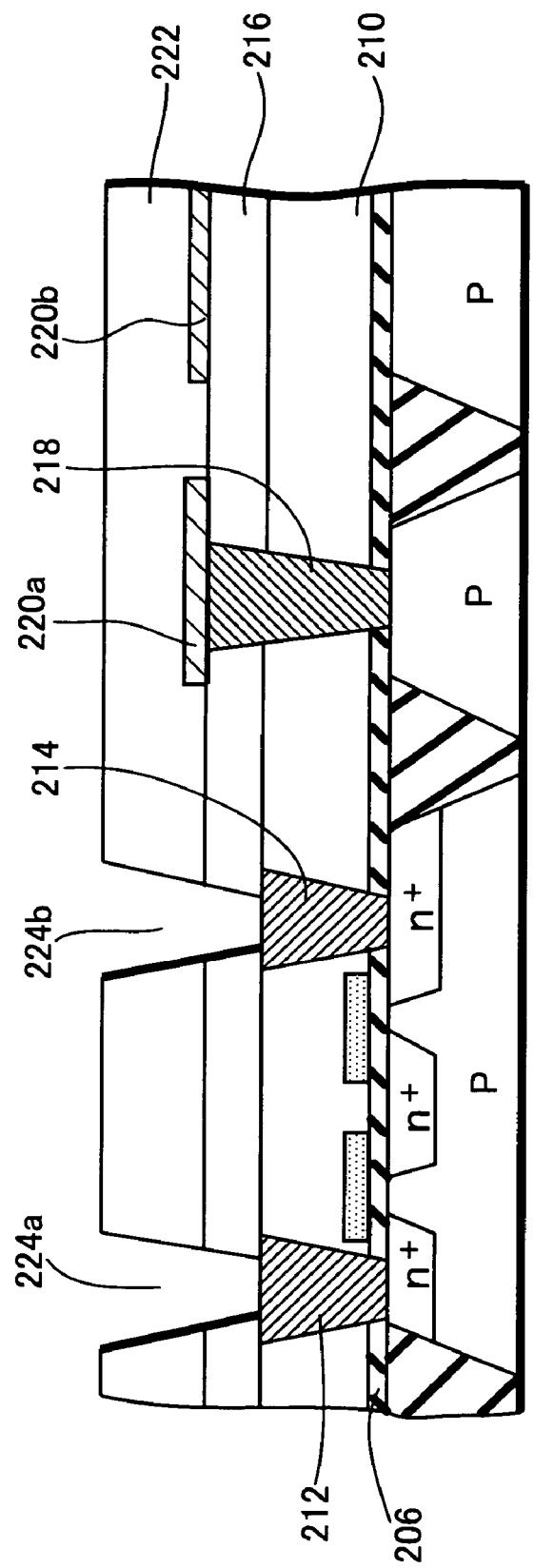
FIG. 6 is a cross-sectional view of the device in a third manufacturing step taken along line A-A' of FIG. 2.

In FIG. 6, an HDP oxide film (high-density plasma oxide film) 222 is formed on the first metal layer 220*a* and 220*b* as an interlayer insulating film. Then, contact holes 224*a* and 224 bare formed to expose part of top faces of the embedded electrodes 212 and 214 in the memory cell area, respectively.

Figure 7:
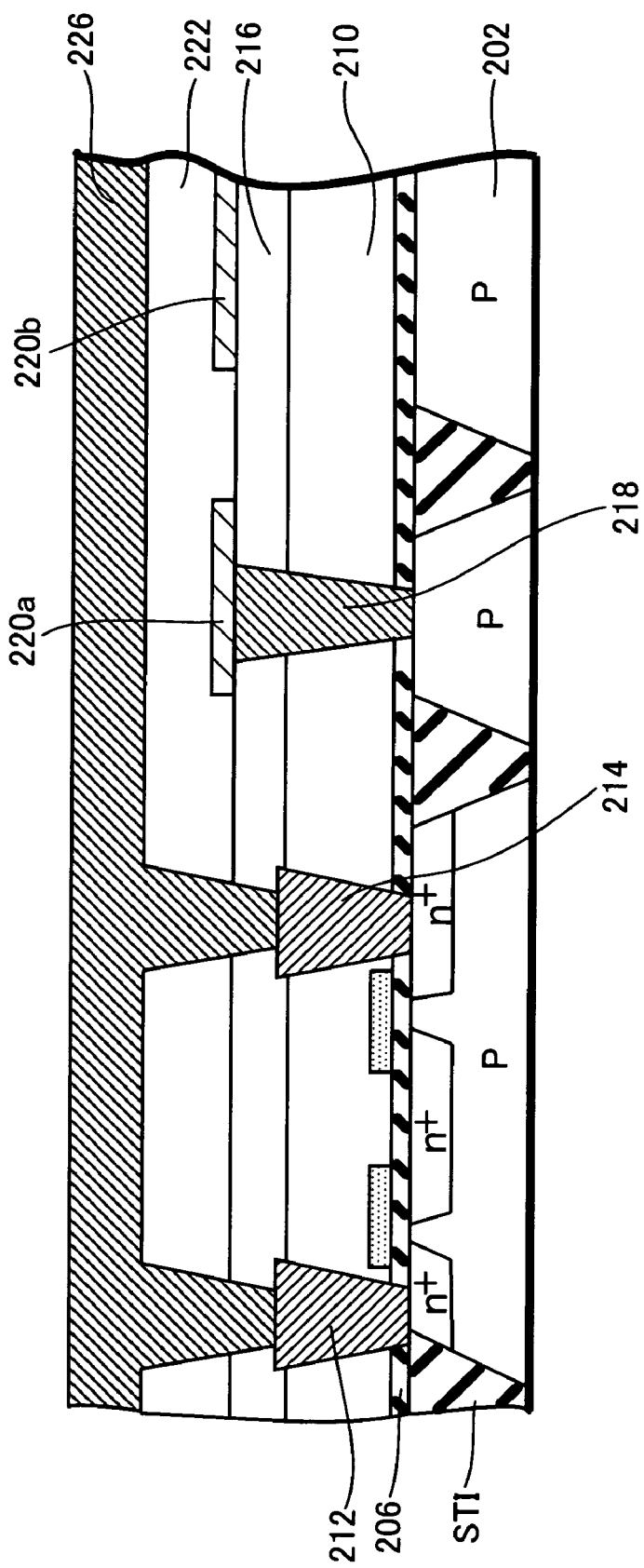
FIG. 7 is a cross-sectional view of the device in a fourth manufacturing step taken along line A-A' of FIG. 2.

In FIG. 7, a tungsten (W) layer 226 is deposited by CVD. The tungsten layer 226 includes a barrier layer made of titanium nitride and a low resistance layer made of titanium silicide, not shown.

Figure 8:
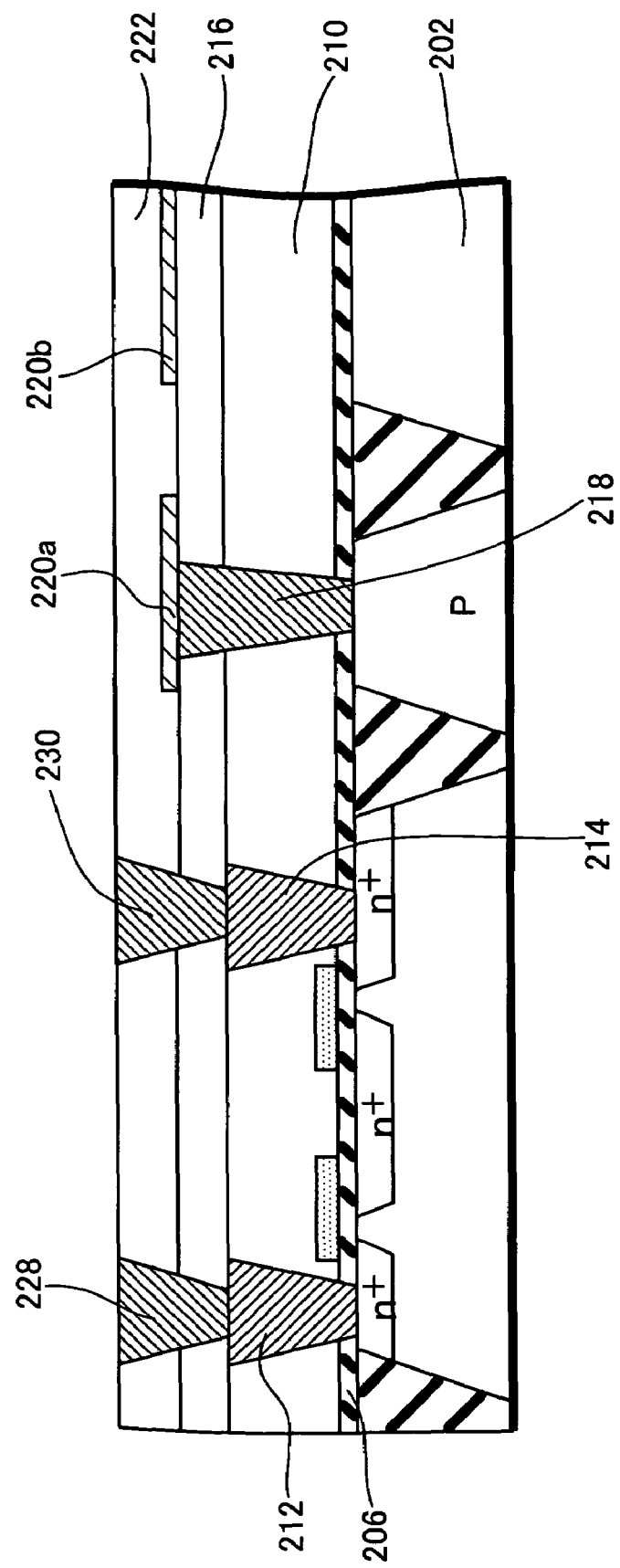
FIG. 8 is a cross-sectional view of the device in a fifth manufacturing step taken along line A-A' of FIG. 2.

In FIG. 8, the tungsten (W) layer is polished by CMP (Chemical Mechanical Polishing). Embedded electrodes 228 and 230 are thereby formed.

Figure 9:
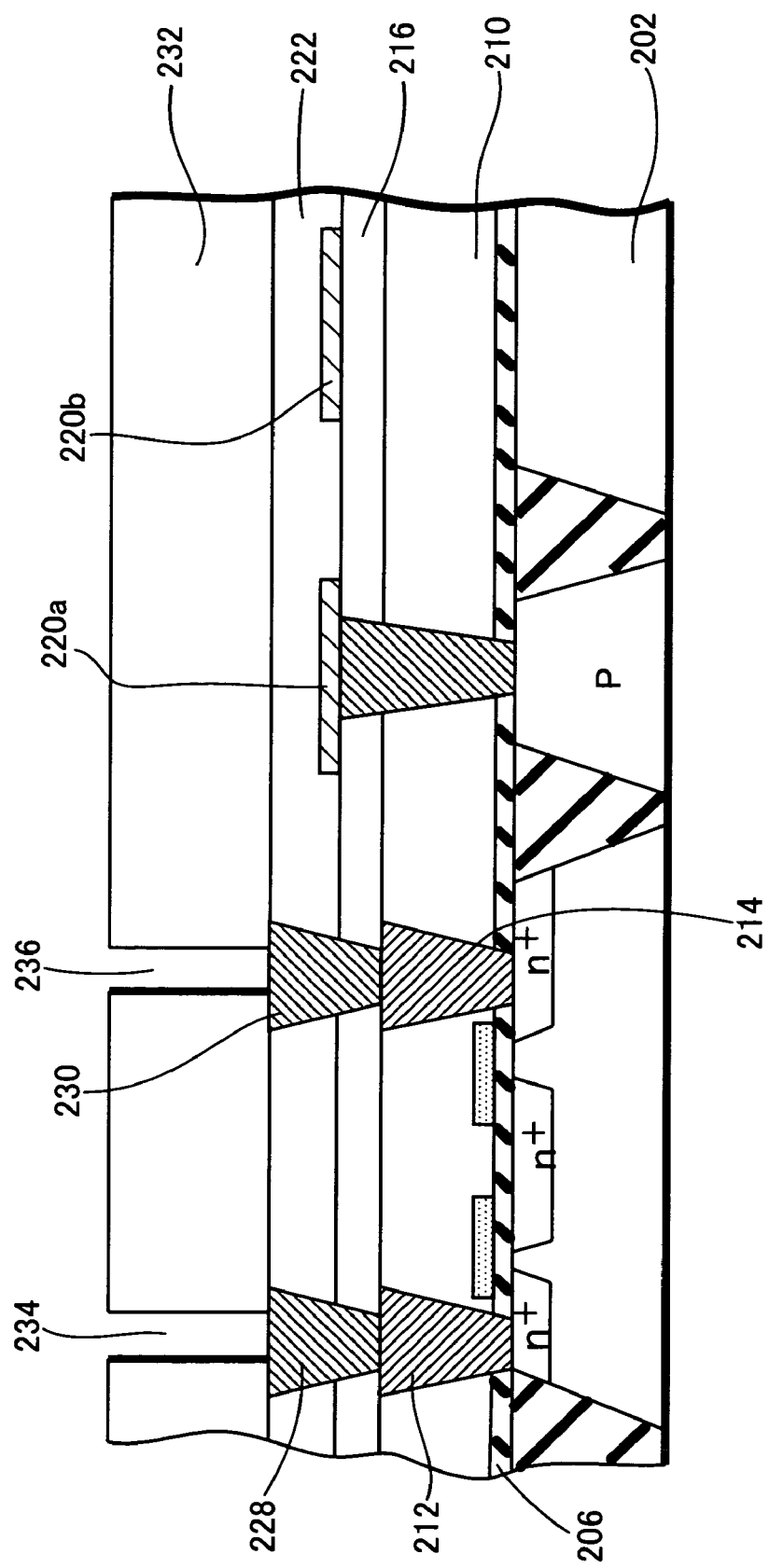
FIG. 9 is a cross-sectional view of the device in a sixth manufacturing step taken along line A-A' of FIG. 2.

In FIG. 9, an interlayer insulating film (for example, HDP (high-density plasma) oxide film) 232 is formed, and in part of the inter layer insulating film 232, through holes (contact holes) 234 and 236 are formed respectively to expose top faces of the embedded electrodes 228 and 230.

Figure 10:
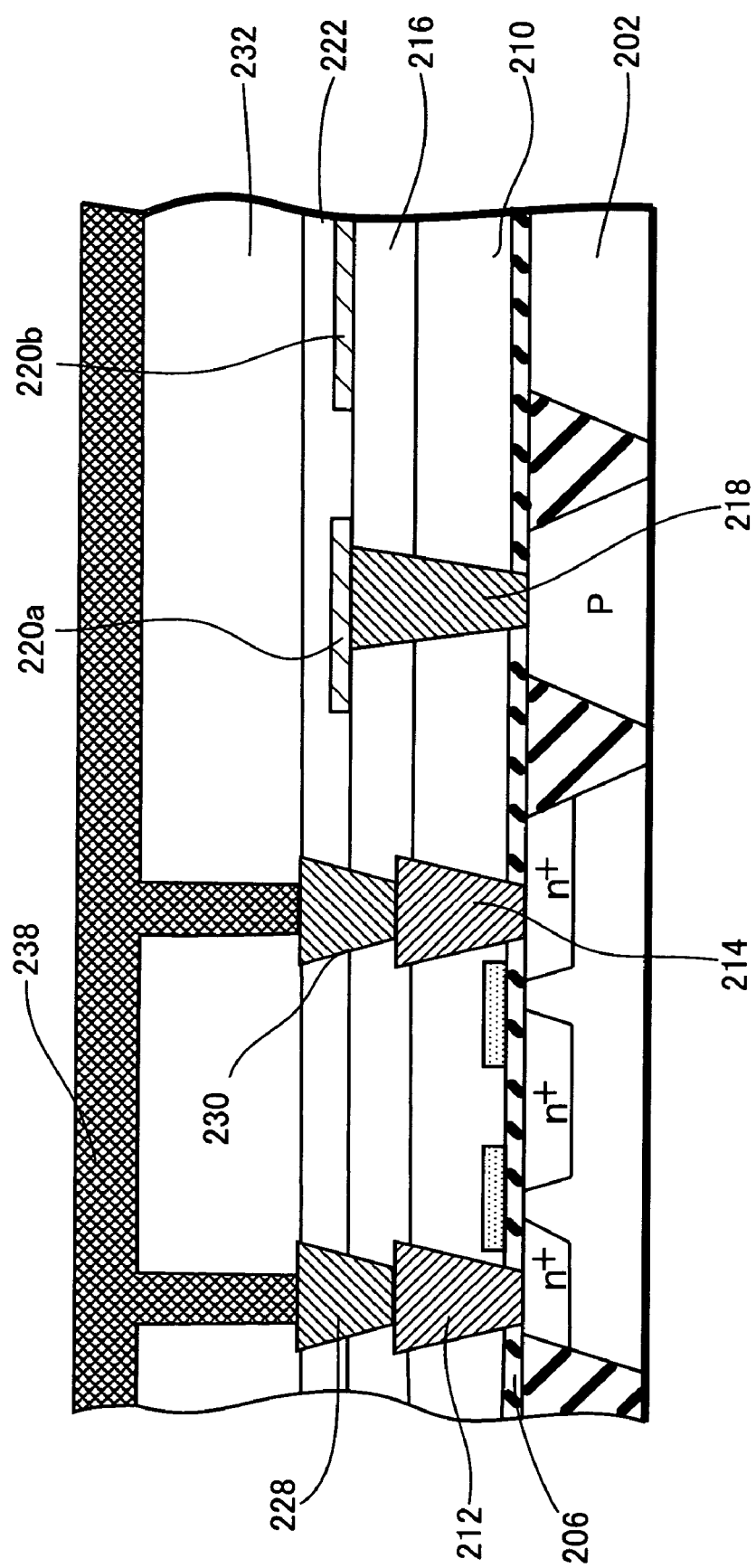
FIG. 10 is a cross-sectional view of the device in a seventh manufacturing step taken along line A-A' of FIG. 2.

In FIG. 10, a titanium nitride (TiN) layer 238 is deposited by CVD.

Figure 11:
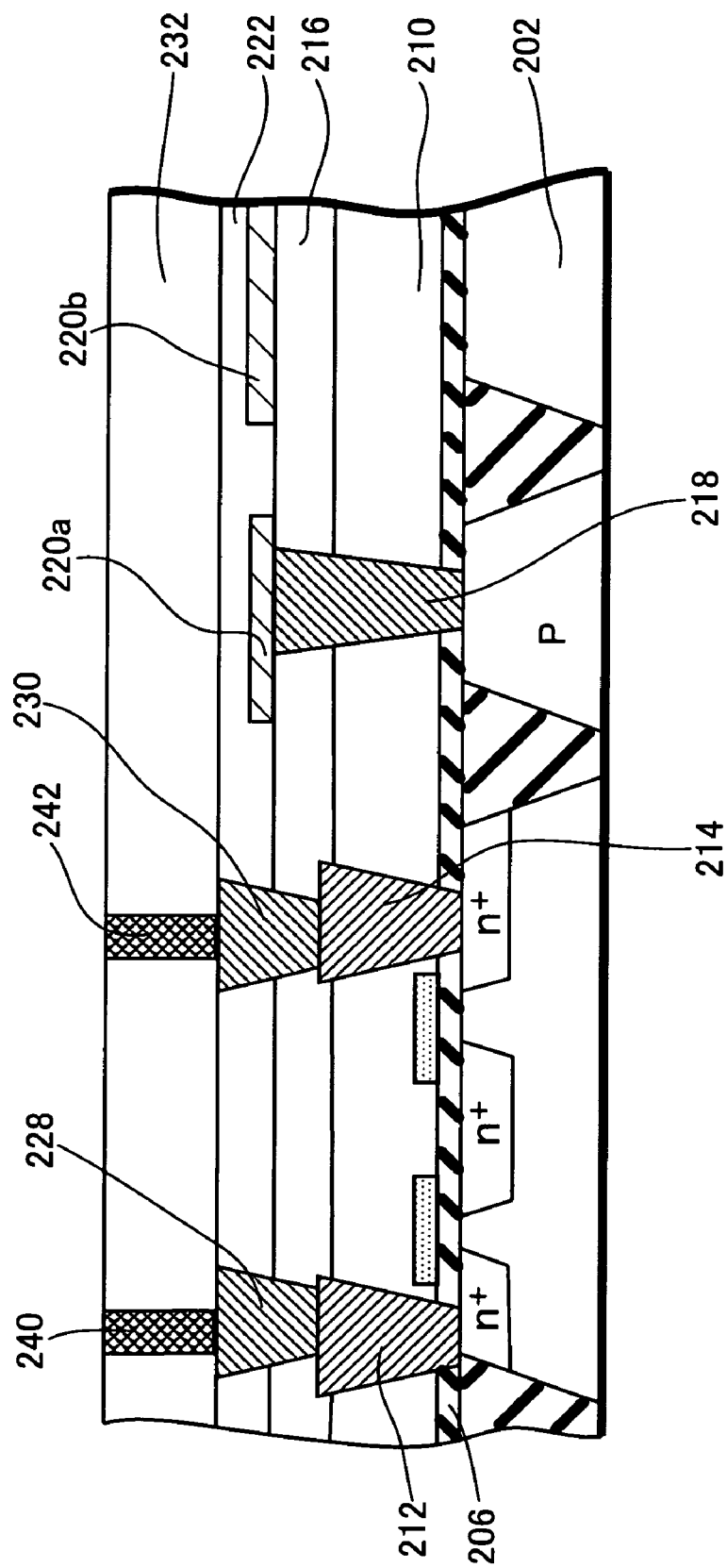
FIG. 11 is a cross-sectional view of the device in an eighth manufacturing step taken along line A-A' of FIG. 2.

In FIG. 11, the titanium nitride (TiN) layer 238 is polished by CMP. Heater electrodes 240 and 242 (corresponding to the heater electrode 111 in FIG. 1 or H1 and H2 in FIG. 3) are thereby formed.

Figure 12:
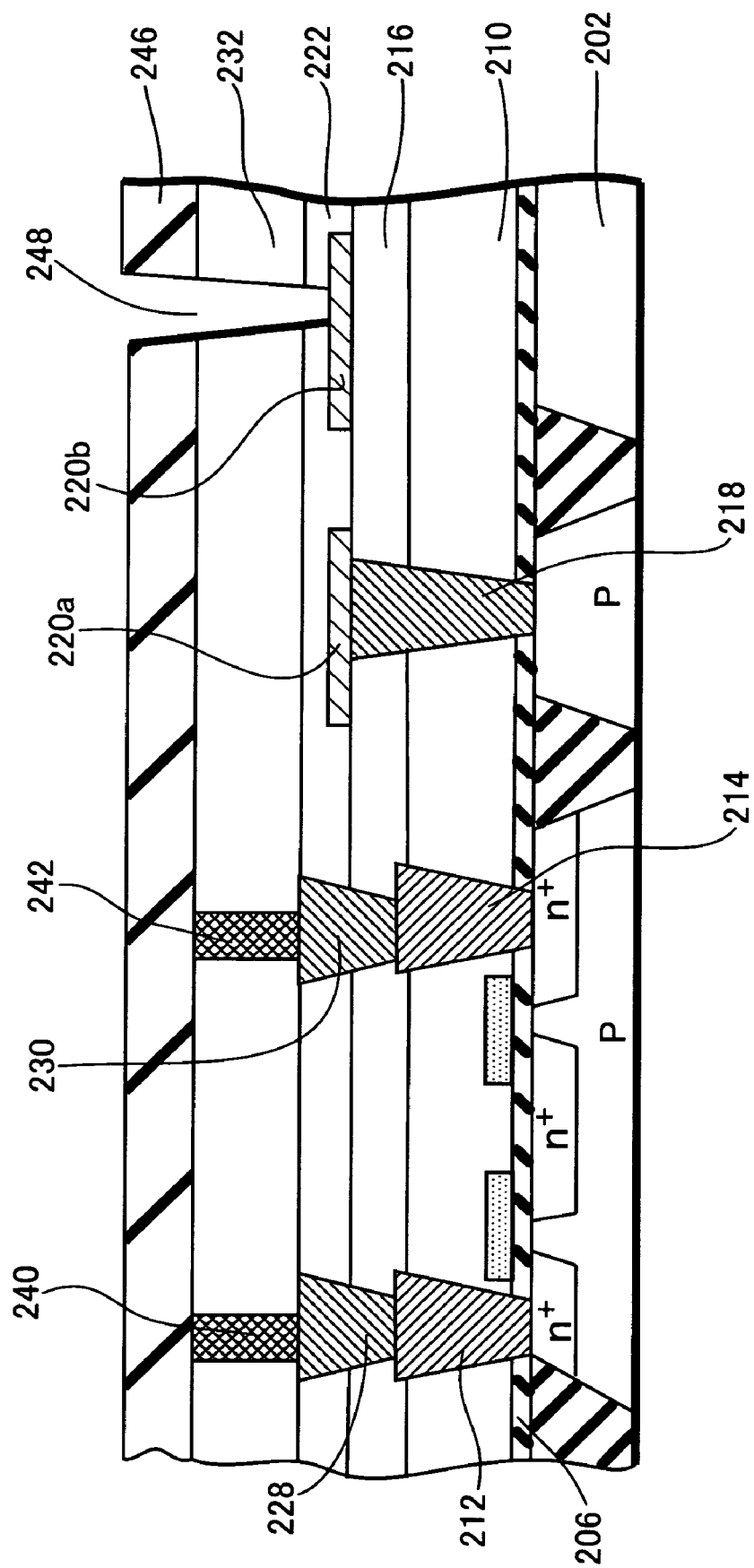
FIG. 12 is a cross-sectional view of the device in a ninth manufacturing step taken along line A-A' of FIG. 2.

In FIG. 12, an oxide film 246 is formed on the heater electrodes 240 and 242 by plasma CVD. The thickness of the oxide film 246 is about 50 nm. The oxide film 246 corresponds to the insulating film 112 in FIG. 1.

Formed next is a contact hole 248 (corresponding to CN2 in FIG. 3) penetrating the interlayer insulating films 246, 232 and 222.

Figure 13:
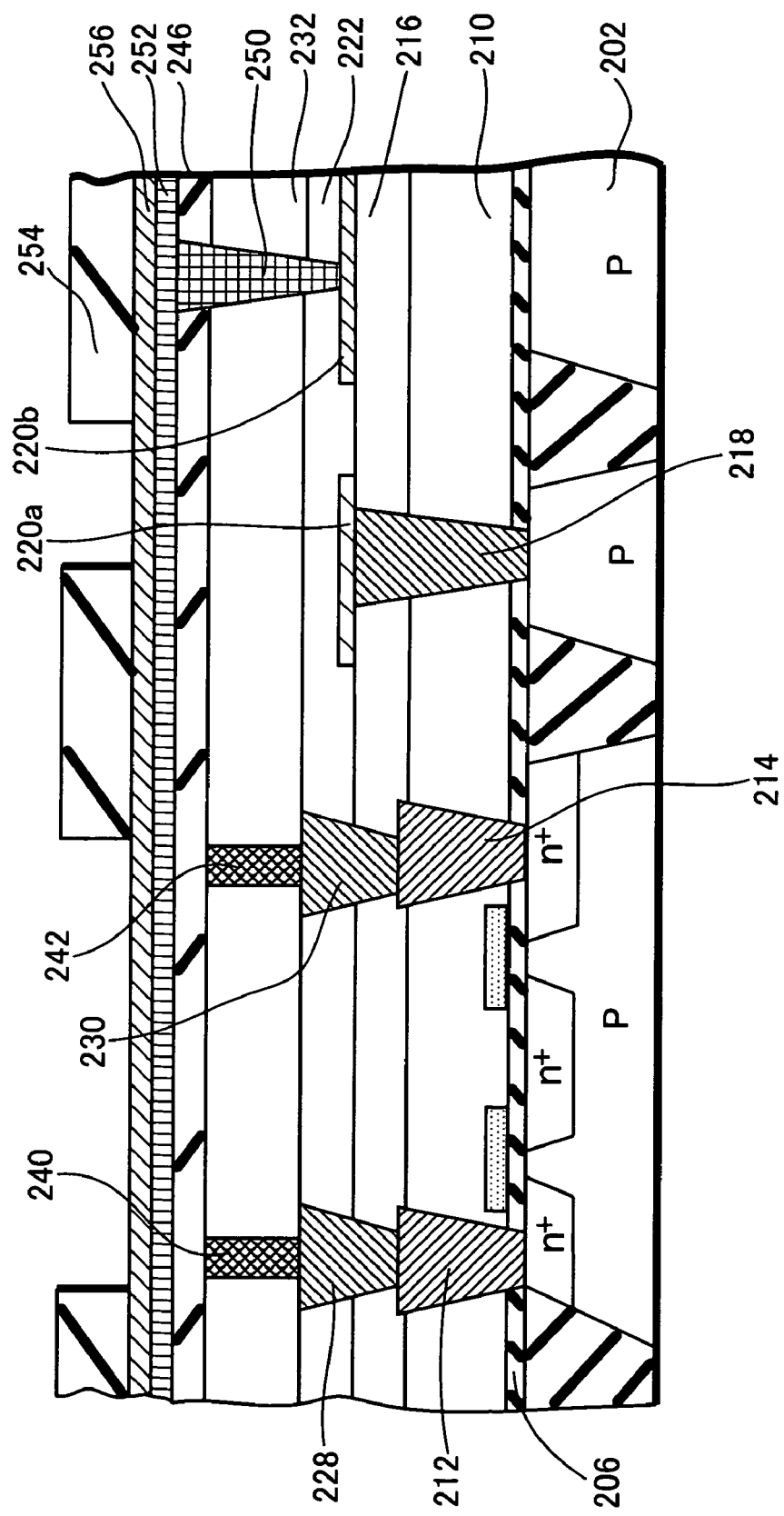
FIG. 13 is a cross-sectional view of the device in a tenth manufacturing step taken along line A-A' of FIG. 2.

In FIG. 13, an embedded electrode 250 is first formed. Then, the landing electrode layer (comprised of a tungsten (W) layer 252 to be a main electrode layer and an adhesion layer 256 made of titanium (Ti)) is formed as the second metal layer (AL2: see FIG. 3).

The thickness of the tungsten (W) layer 252 is about 50 nm. The thickness of the titanium (Ti) layer as an adhesion layer is about 1 nm. The landing electrode layer (252 and 256) corresponds to the landing electrode layer (113*a* and 114*a*) in FIG. 1. Next, a resist mask 254 is formed on the landing electrode layer (252 and 256).

Figure 14:
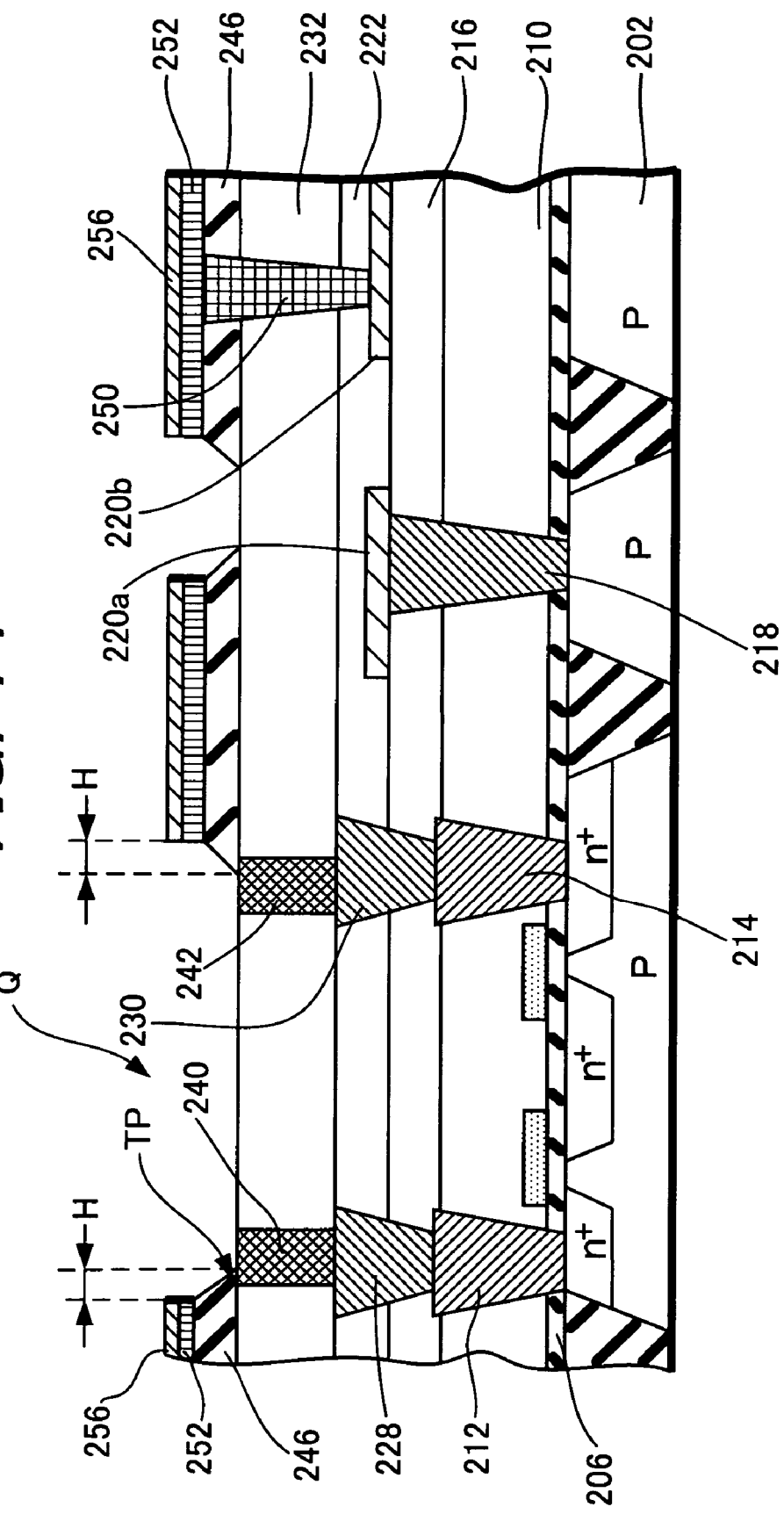
FIG. 14 is a cross-sectional view of the device in an eleventh manufacturing step taken along line A-A' of FIG. 2.

In FIG. 14, using the common mask, the landing electrode layer (252 and 256) is successively etched by dry etching. The opening Q (see FIG. 3) is thereby formed in the memory cell area (on the left side in FIG. 14) Then, the resist mask is removed.

It is herein noted that the processed cross section of the oxide film 246 has a tilting shape (tapered shape). In FIG. 14, the slant portion of the processed end face of the oxide film 246 is expressed by TP. By this means, the processed end portion of the landing electrode layer (252 and 256) and the end portion of the exposed face of the heater electrode 242 are automatically spaced apart from each other in the horizontal direction by "H". This respect will specifically be described below.

The relative positional relationship between a position of the heater electrode (240 and 242) and a position of the processed end portion of the landing electrode layer (252 and 256) is very important. In other words, the landing electrode layer (252 and 256) should not exhibit good contact between the heater electrode (240 and 242) and a phase change layer (GST) 258. Meanwhile, when the end portion of the landing electrode layer (252 and 256) is spaced a too much distance apart from near the contact face of the heater electrode (240 and 242) and the phase change layer (GST) 258, the demand for reduction in the size of a memory cell is not met. Therefore, in the method of manufacturing the phase change memory LSI of the invention, the positioning technique so-called self alignment is adopted where relative positions of the heater electrode and the end portion of the landing electrode are automatically determined.

In other words, in patterning the insulating film 246 on the interlayer insulating film 232 with the heater electrode (240 and 242) embedded therein, using the common mask (reference numeral 254 in FIG. 13), the landing electrode layer (240 and 242) and insulating film 246 are successively etched.

At this point, since an etching rate of the landing electrode layer (252 and 256) is high, the cross section of the processed portion of the landing electrode (252 and 256) is substantially perpendicular.

On the other hand, since an etching rate of the insulating film 246 is low, re-growth of the insulating film concurrently proceeds during etching, and the cross section of the processed portion of the insulating film has a tapered (slant) shape. By this means, the end portion of the contact face of the heater electrode and phase change layer is formed apart from the end portion of the landing electrode layer (252 and 256) by the distance "H" such that the processed end face of the insulating film 246 has the slant shape and thus extends in the horizontal direction. Accordingly, the relative positional relationship between the end portion of the landing electrode layer (252 and 256) and the contact face of the heater electrode (240 and 242) and phase change layer (256) is automatically determined, the problem does not arise in positioning, and manufacturing of minute phase change memory element is facilitated.

Further, another point to be noted in the step of FIG. 14 is that the material (252 and 256) for the landing electrode layer is also patterned in the peripheral circuit area (on the right side in FIG. 14), and the electrode (or wiring) is thereby formed that is connected to the embedded electrode 250.

In other words, in the phase change memory element of the invention, the landing electrode layer (252 and 256) is provided in manufacturing process independently of the phase change layer (GST) 258. Accordingly, it is made possible to form the electrode and wiring in the peripheral circuit area concurrently with formation of the landing electrode layer in the memory cell area. The sharing of the manufacturing process is thereby made possible, and manufacturing of a large scale of phase change memory LSI is facilitated.

Figure 15:
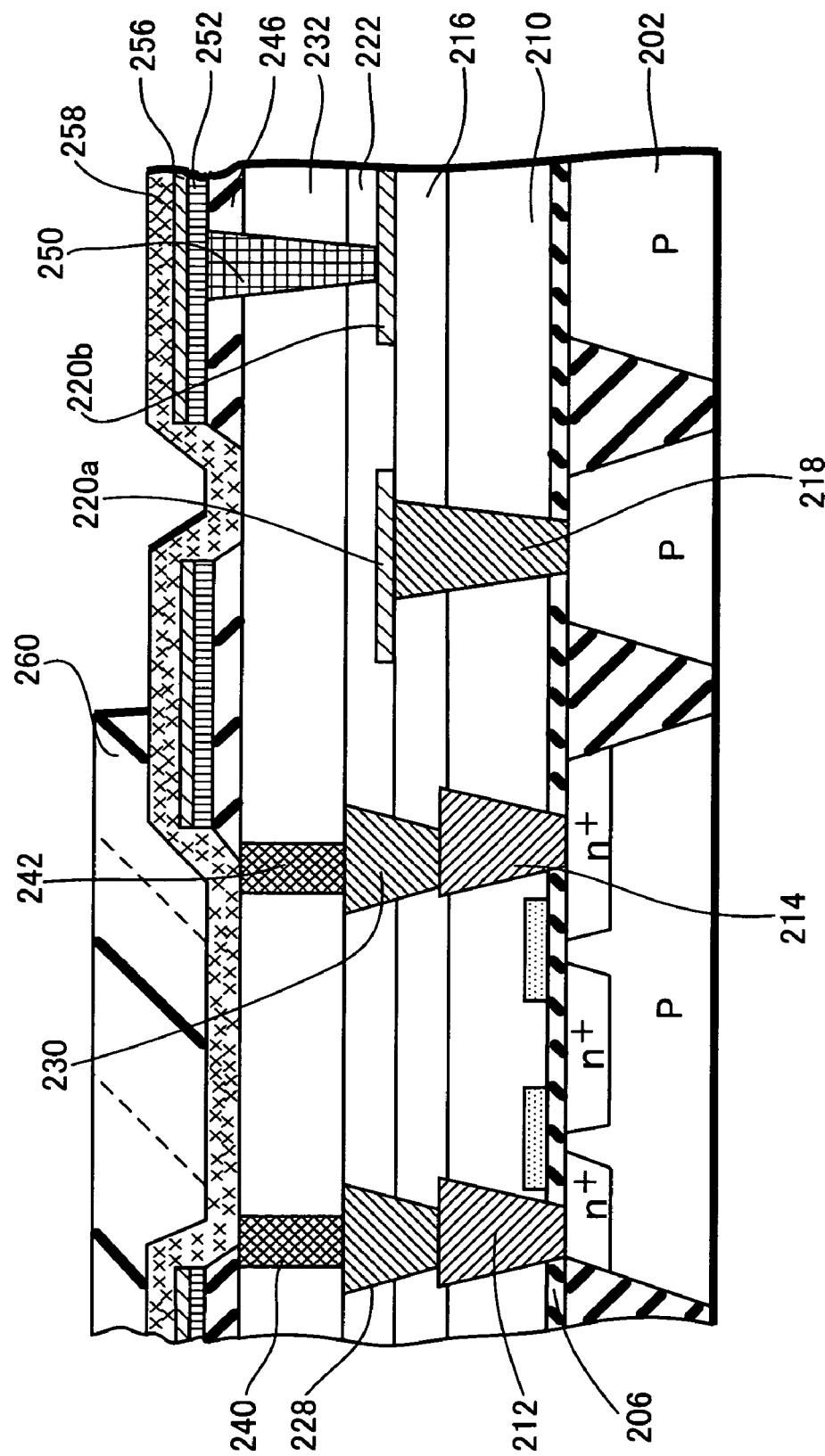
FIG. 15 is a cross-sectional view of the device in a twelfth manufacturing step taken along line A-A' of FIG. 2.

In FIG. 15, the phase change layer (GST) 258 is deposited over the entire surface of the semiconductor substrate in a thickness of about 100 nm using a sputtering method. Then, a processing mask 260 is formed on the phase change layer (GST) 258.

Figure 16:
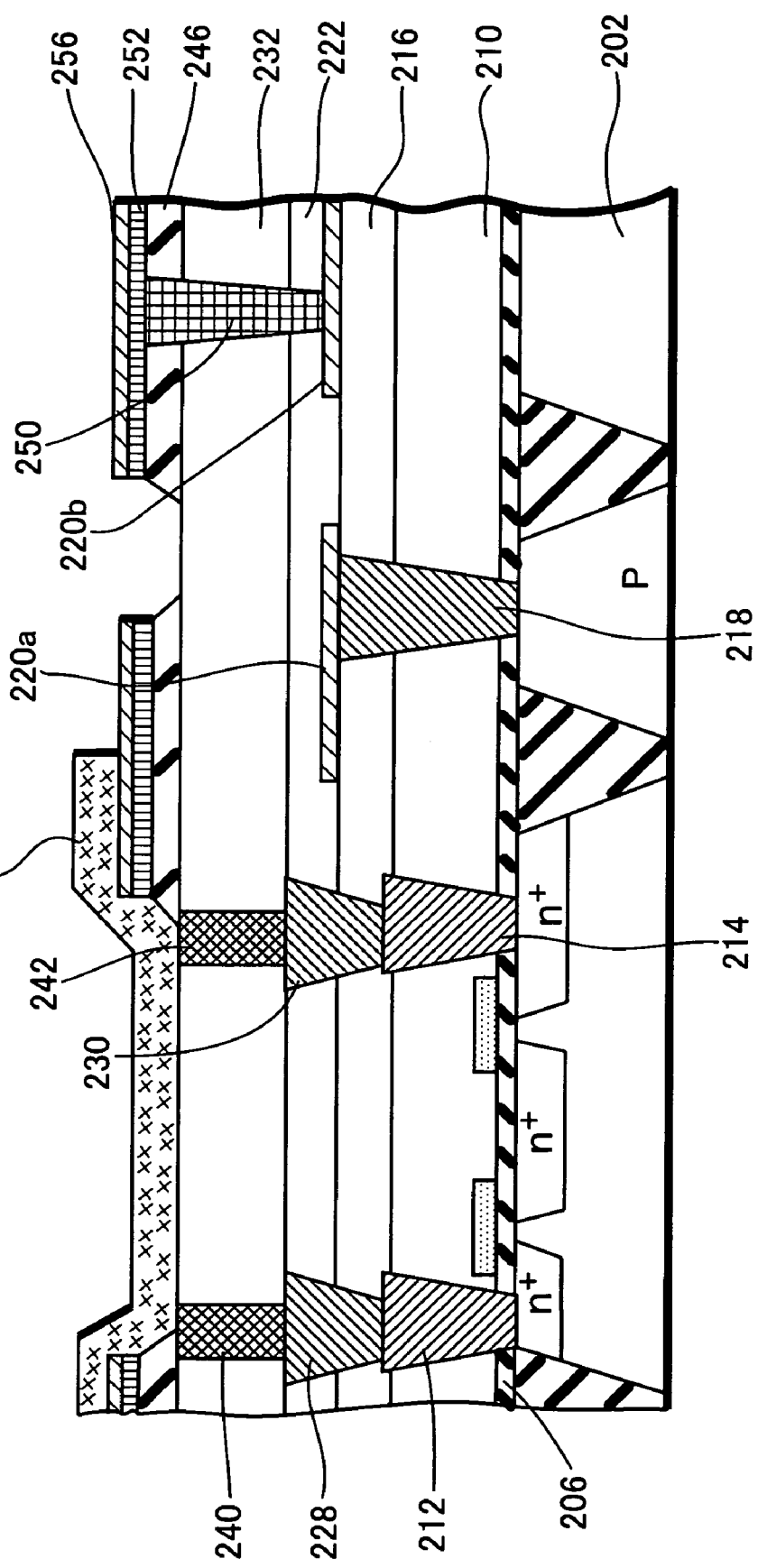
FIG. 16 is a cross-sectional view of the device in a thirteenth manufacturing step taken along line A-A' of FIG. 2.

In FIG. 16, using the processing mask 260 in FIG. 15, the phase change layer (GST) 258 is patterned. Then, the processing mask 260 is removed.

Figure 17:
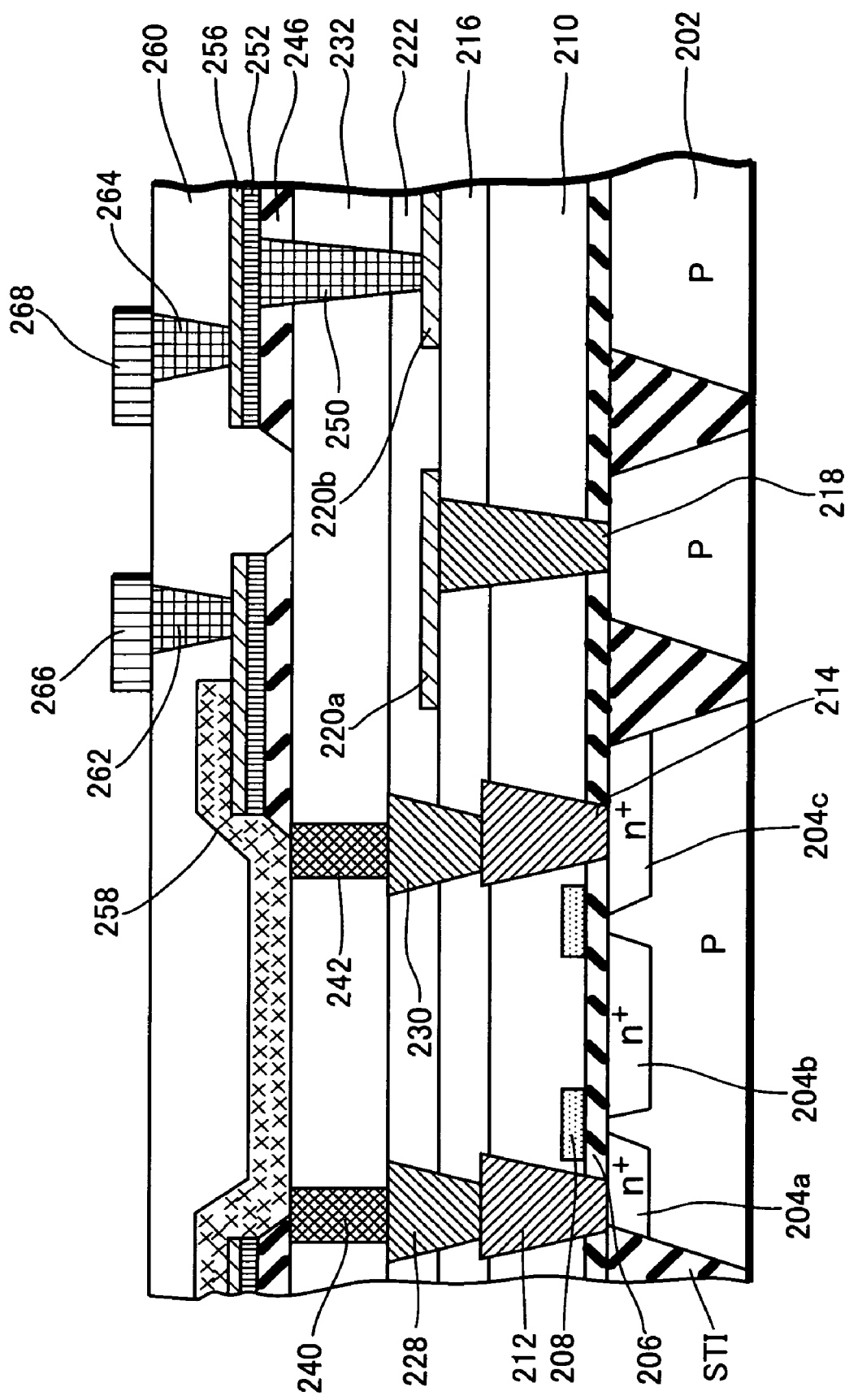
FIG. 17 is a cross-sectional view of the device in a fourteenth manufacturing step taken along line A-A' of FIG. 2.

In FIG. 17, an interlayer insulating film 260 is formed, and the contact holes CN3 are formed in part of the interlayer insulating film 260 (see FIG. 3). Then, embedded electrodes 262 and 264 are formed inside the contact holes CN3, and subsequently, electrodes 266 and 268 made of tungsten (W) are formed as the third metal layer (AL3: see FIG. 3). FIG. 17 shows a cross-sectional structure taken along line A-A' of FIG. 3.

In the foregoing, the present invention is described with reference to the embodiments. However, the present invention is not limited to the embodiments, and is capable of being modified and/or applied in various manners within the scope of the technical idea of the invention.

Figure 18:
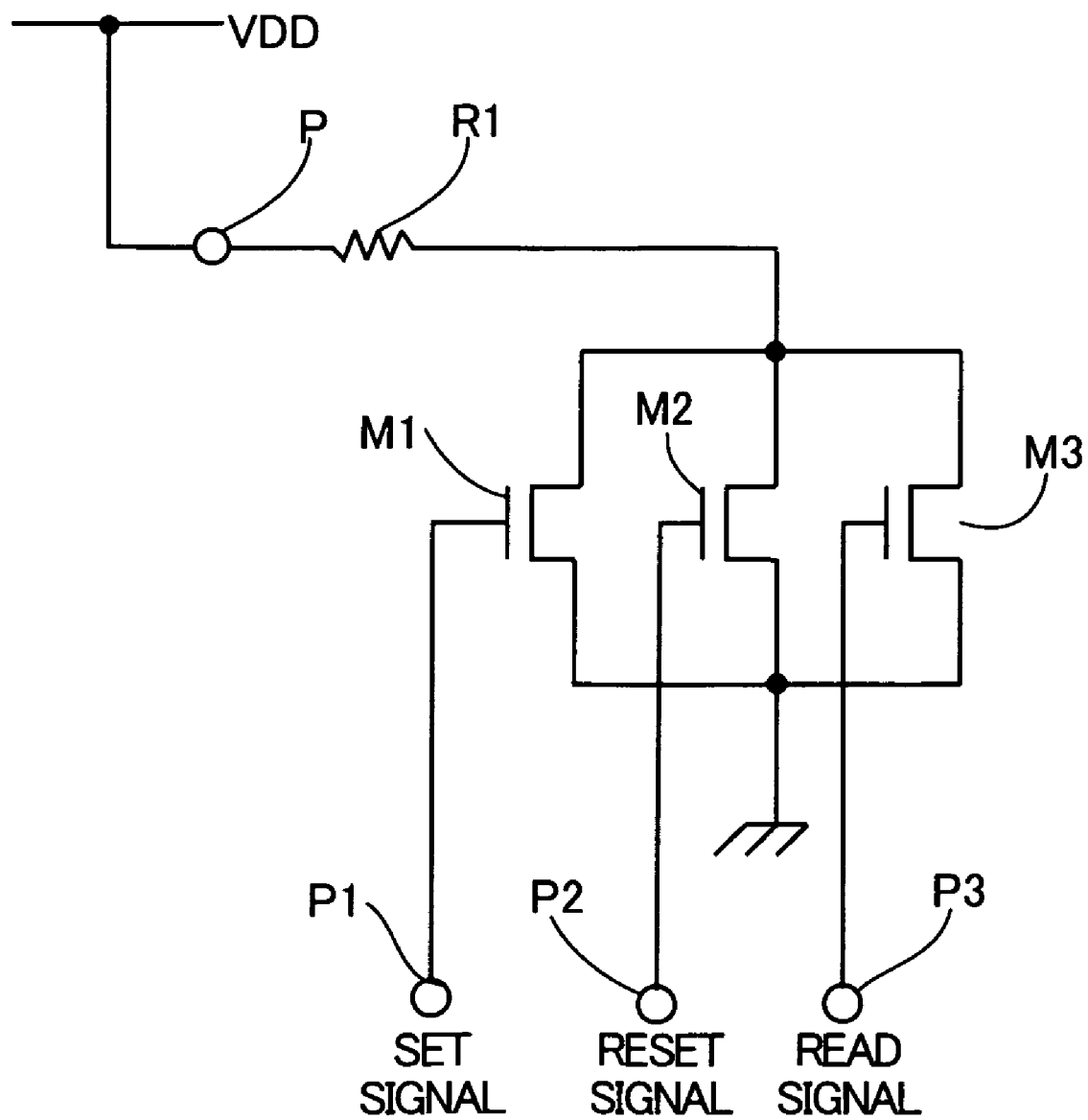
FIG. 18 is a circuit diagram showing another example of a circuit scheme of the phase change memory device of the invention.

In the above-mentioned description, a circuit scheme is adopted where the set pulse S1 and reset pulse S2 are supplied from the terminal P, but may be a circuit scheme as shown in FIG. 18. In other words, as a circuit scheme of phase change memory LSI, instead of inputting pulses with different waveforms, a scheme can be adopted where transistors with different sizes are selectively brought into conduction to draw the current.

FIG. 18 is a circuit diagram showing an example of the circuit scheme of the phase change memory element.

In FIG. 18, a resistance R1 is a resistance equivalent to the phase change memory element, and the terminal P is connected to VDD (power supply potential). M1 to M3 are MOS transistors with adjusted sizes, and P1, P2 and P3 are respectively a set pulse terminal, reset pulse terminal and read pulse terminal.

P1 to P3 are used to select one transistor to be ON from among the MOS transistors M1 to M3, while controlling the respective conduction time of the MOS transistors M1 to M3. It is thereby possible to implement each operation of set, reset and read.

Further, substituting for the MOS transistor constituting part of the memory cell, it is possible to use a switching element such as a bipolar transistor, junction diode, Schottky barrier diode and the like. As the phase change layer, any materials can be used as well as chalcogenide alloys. Furthermore, the landing electrode layer can be used as a wiring layer in the memory cell area.

As described above, according to the present invention, provided is the novel basic structure (a basic structure with high thermal efficiency where an electrode does not exist on the upper side of the phase change layer) of the phase change memory device, substituting for the conventional typical basic structure (where the phase change layer is sandwiched between upper and lower electrodes).

In other words, in the phase change memory device of the invention, since an electrode acting as a radiating fin does not exist immediately above the phase change area of the phase change layer, Joule heat caused by the current is not dissipated via an electrode unlike the conventional structure, and thermal efficiency is improved in phase change treatment. Accordingly, the reset current can be reduced, and the memory cell size can be decreased.

Further, since the upper electrode as in the conventional structure does not exist, any problems do not occur with the thickness of the electrode. In other words, in the phase change memory element of the invention, it is possible to form a landing electrode layer with a sufficient thickness without any problems, and the resistance in wiring can thus be reduced.

Furthermore, since the phase change layer such as GST or the like does not exist immediately below the contact electrode, any problems do not occur such as pollution due to exposure of the phase change layer in making an opening for a contact hole, sublimation and/or disappearance of part of the layer, and occurrence of failure in embedding the contact hole.

Still furthermore, in the phase change memory device of the invention, the bottom of the phase change layer is brought into contact with the landing electrode (metal layer), and the adhesion is improved as compared with the conventional structure where the phase change layer is brought into contact with the insulating film.

Moreover, even when an adhesion layer comprised of a thin film of titanium (Ti) or the like is formed on the landing electrode layer to improve the adhesion, since the adhesion layer does not contact the phase change layer in a region where phase transition occurs, the problem as in the conventional structure does not arise that components of both layers are bonded in the region where phase transition occurs and that the composition changes, and therefore, the rewritable characteristics are not affected. Meanwhile, in the portion of the phase change layer in contact with the adhesion layer (i.e. the area except the region for phase transition), by heat treatment in a subsequent process and the like, components of both the layers are bonded, the composition substantially changes, and the adhesion between the layers is thereby improved. Therefore, according to the invention, without imposing any adverse effects on the rewritable characteristics of the phase change memory element, it is possible to reliably dissolve the problem of peeling of the phase change layer.

Further, in the phase change memory device of the invention, by varying patterns of the landing electrode layer, it is possible to freely change a formation position of the contact electrode, and flexibility in design of layout is improved.

Furthermore, the phase change memory device of the invention has many advantages that the thermal efficiency is high, the problems in the manufacturing process feared in the conventional structure are all solved, the manufacturing steps can be shared, and that flexibility in design of layout is high. Accordingly, it is possible to perform stable mass production of a large scale of phase change memory LSI.

Moreover, the method of manufacturing a phase change memory device of the invention is based on basic techniques for manufacturing process of silicon-based LSI, and does not need any special steps. Accordingly, it is possible to produce the phase change memory device of the invention in large quantities with ease without undue processing.

Further, in the method of manufacturing a phase change memory device of the invention, using a common mask, the landing electrode layer and insulating film are patterned successively, and the processed cross section of the insulating film is formed in slant-shape, whereby suitable positioning of the heater electrode and the end portion of the landing electrode can be made in self alignment. Accordingly, accurate positioning can be made on structural elements of the memory cell, and manufacturing of minute phase change memory element is facilitated.

Furthermore, in the method of manufacturing a phase change memory device of the invention, the landing electrode layer (metal layer such as tungsten (W) or the like) is provided in manufacturing process independently of the phase change layer. Accordingly, it is made possible to form the electrode and wiring in the peripheral circuit concurrently with formation of the landing electrode layer in the memory cell, and the sharing of the manufacturing process is thereby made possible. Manufacturing of a large scale of phase change memory LSI is thereby facilitated.

According to the invention, it is possible to achieve the phase change memory device having a structure provided with high thermal efficiency, all the problems due to manufacturing of LSI of the phase change memory are solved, and it is made possible to perform mass production of a large scale of phase change memory LSI.

The present invention actualizes the phase change memory element having a structure provided with thermal efficiency, has the effect of enabling mass production of a large scale of phase change memory LSI, and thus is useful as a phase change memory device and a method of manufacturing the phase change memory device.

This application is based on the Japanese Patent Application No. 2005-264484 filed on Sep. 12, 2005, the entire content of which is expressly incorporated by reference herein.

What is claimed is:

1. A semiconductor device comprising:
a first insulating layer having an upper surface,
a heater electrode selectively formed in the first insulating layer, the heater electrode having a top surface that is substantially coplanar with the upper surface of the first insulating layer;
a second insulating layer formed to cover the upper surface of the first insulating layer and the top surface of the heater electrode, the second insulating layer including a hole that exposes a part of the top surface of the heater electrode, a remaining part of the top surface of the heater electrode being kept covered by the second insulating layer;
a landing electrode selectively formed on the second insulating layer, the landing electrode thereby including a first surface on a side of the second insulating layer and a second surface opposed to the first surface; and
a phase change layer formed in contact with the part of the heater electrode through the hole, the phase change layer including an elongated portion that is elongated over and in contact with a part of the second surface of the landing electrode with an separation from the remaining part of the top surface of the heater electrode by the second insulating layer.

2. The device as claimed in claim 1, wherein the hole further exposes a part of the upper surface of the first insulating layer together with the part of the top surface of heater electrode, and the phase change layer is in contact with the respective parts of the upper surface of the first insulating layer and of the top surface of the heater electrode.

3. The device as claimed in claim 1, wherein the hole has a lower side on a side of the first insulating layer and an upper side on a side of the landing electrode, the lower side being smaller than the upper side, the second insulating layer including a first edge defining the lower side of the hole and a second edge defining the upper side of the hole.

4. The device as claimed in claim 3, wherein the landing electrode is terminated at a peripheral edge thereof that is substantially aligned with a part of the second edge of the second insulating layer, and the elongated portion of the phase change layer is further in contact with the peripheral edge of the landing electrode.

5. The device as claimed in claim 4, wherein the second insulating layer includes a slant side surface connecting the first and second edges thereof.

6. The device as claimed in claim 1, further comprising:
a third insulating layer covering the phase change layer and the landing electrode, the third insulating layer including a contact hole that exposes a portion of the second surface of the landing electrode which is apart from the part of the second surface of the landing electrode; and
a contact electrode formed in the contact hole in contact with the portion of the second surface of the landing electrode.

7. A semiconductor device comprising:
a semiconductor substrate having a main surface;
a heater electrode formed over the main surface of the semiconductor substrate, the heater electrode having a top surface that is substantially in parallel to the main surface of the semiconductor substrate,
a first insulating film formed to cover the heater electrode and the semiconductor substrate, the first insulating film having a first hole that exposes a part of the top surface of the heater electrode, a remaining part of the top surface of the heater electrode being kept covered by the first insulating film,
a landing electrode selectively formed on the first insulating film, the landing electrode having a lower surface in contact with the first insulating film and an upper surface opposed to the lower surface;
a phase change layer including a first portion that is in contact with the part of the top surface of the heater electrode though the first hole and a second portion that is elongated from the first portion over a first part of the upper surface of the landing electrode in contact therewith;
a second insulating film formed to cover the landing electrode and the phase change layer, the second insulating film having a second hole that exposes a second part of the upper surface of the landing electrode, the second insulating film keeping covering a third part of the upper surface of the landing electrode between the first and second parts of the upper surface of the landing electrode; and
a contact electrode formed in contact with the second part of the upper surface of the landing electrode through the second hole.

8. The device as claimed in claim 7, wherein the first hole is formed in tapered shape.

9. The device as claimed in claim 7, wherein the first hole is formed in tapered shape with a first angle and the second hole is formed in a tapered shape with a second angle that is different from the first angle.

10. The device as claimed in claim 9, wherein the first angle is lager than the second angle.

11. The device as claimed in claim 7, further comprising an upper electrode formed on the second insulating film in contact with the contact electrode.

12. The device as claimed in claim 11, further comprising a lower electrode formed between the heater electrode and the semiconductor substrate in contact with the heater electrode.

* * * * *